(12) United States Patent
Aritome

(10) Patent No.: US 8,964,472 B2
(45) Date of Patent: Feb. 24, 2015

(54) SEMICONDUCTOR MEMORY DEVICE

(71) Applicant: SK Hynix Inc., Gyeonggi-do (KR)

(72) Inventor: Seiichi Aritome, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/094,300

(22) Filed: Dec. 2, 2013

(65) Prior Publication Data

US 2015/0003158 A1 Jan. 1, 2015

(30) Foreign Application Priority Data

Jun. 28, 2013 (KR) ........................ 10-2013-0075220

(51) Int. Cl.
*G11C 16/04* (2006.01)
*G11C 16/10* (2006.01)
*G11C 16/34* (2006.01)
(52) U.S. Cl.
CPC ........ *G11C 16/0408* (2013.01); *G11C 16/0483* (2013.01); *G11C 16/10* (2013.01); *G11C 16/3404* (2013.01)
USPC ..................... 365/185.11; 365/63; 365/230.03
(58) Field of Classification Search
CPC ........... G11C 16/0483; G11C 16/3404; G11C 16/30; G11C 16/10; G11C 16/08; G11C 7/18; G11C 8/14

USPC .......... 365/63, 185.11, 185.18, 185.2, 230.03
See application file for complete search history.

(56) References Cited

U.S. PATENT DOCUMENTS

| 8,811,082 B2* | 8/2014 | Kwon et al. .............. 365/185.11 |
| 2008/0180981 A1* | 7/2008 | Park et al. ........................ 365/51 |
| 2011/0273927 A1* | 11/2011 | Hanzawa et al. ............. 365/163 |
| 2012/0069664 A1* | 3/2012 | Kim et al. ................. 365/185.11 |
| 2013/0262751 A1* | 10/2013 | Kwak ............................ 711/103 |
| 2014/0189258 A1* | 7/2014 | Aritome ........................ 711/147 |

FOREIGN PATENT DOCUMENTS

KR 1020100052597 5/2010

* cited by examiner

*Primary Examiner* — Gene Auduong
(74) *Attorney, Agent, or Firm* — IP&T Group LLP

(57) ABSTRACT

A semiconductor memory device includes a memory array including memory blocks stacked in a plurality of layers on a substrate, first vertical lines suitable for coupling bit lines, and second vertical lines suitable for coupling word lines of the memory blocks vertically stacked, wherein the memory blocks include selection lines vertically stacked and separated from each other, and the bit lines are coupled to the memory blocks and arranged in a plurality of layers.

22 Claims, 14 Drawing Sheets

SEMICONDUCTOR MEMORY DEVICE

CROSS-REFERENCE TO RELATED APPLICATION

The present application claims priority of Korean patent application number 10-2013-0075220 filed on Jun. 28, 2013, in the Korean Intellectual Property Office, the entire disclosure of which is incorporated by reference herein.

BACKGROUND

1. Technical Field

Various embodiments of the present invention relate generally to a semiconductor memory device and, more particularly, to a semiconductor memory device including memory cells stacked in a direction vertical to a substrate.

2. Related Art

One possible way to increase storage capacity is to provide a larger number of memory cells within a predetermined area. The number of memory cells may be increased by reducing memory cell size, but there are limitations in memory cell size reduction. A method for increasing the number of memory cells is to provide a three-dimensional (3D) structured memory block or memory string where memory cells are stacked in a direction vertical to a semiconductor substrate. The 3D structured memory string may include a vertical channel that is formed of silicon. The vertical channel may be formed between a bit line and a common source line.

Recently, a method of increasing density of three-dimensional memory blocks within a predetermined area has been in demand, and a method of preventing deterioration of electrical characteristics caused thereby has also been in demand.

BRIEF SUMMARY

Various embodiments relate to a semiconductor memory device that may have a large number of memory cells within a predetermined area while preventing deterioration of electrical characteristics.

A semiconductor memory device according to an embodiment of the present invention includes a memory array including memory blocks stacked in a plurality of layers on a substrate, first vertical lines suitable for coupling bit lines, and second vertical lines suitable for coupling word lines of the memory blocks that are vertically stacked, wherein the memory blocks include selection lines vertically stacked and separated from each other, and the bit lines are coupled to the memory blocks and arranged in a plurality of layers.

A semiconductor memory device according to another embodiment of the present invention includes first and second memory arrays respectively including memory blocks stacked in a plurality of layers on a substrate, first upper bit lines coupled to upper memory blocks among the memory blocks included in the first memory array, first lower bit lines coupled to lower memory blocks among the memory blocks included in the first memory array, second upper bit lines coupled to the upper memory blocks among the memory blocks included in the second memory array and second lower bit lines coupled to the lower memory blocks among the memory blocks included in the second memory array.

DETAILED DESCRIPTION

Figure 1:
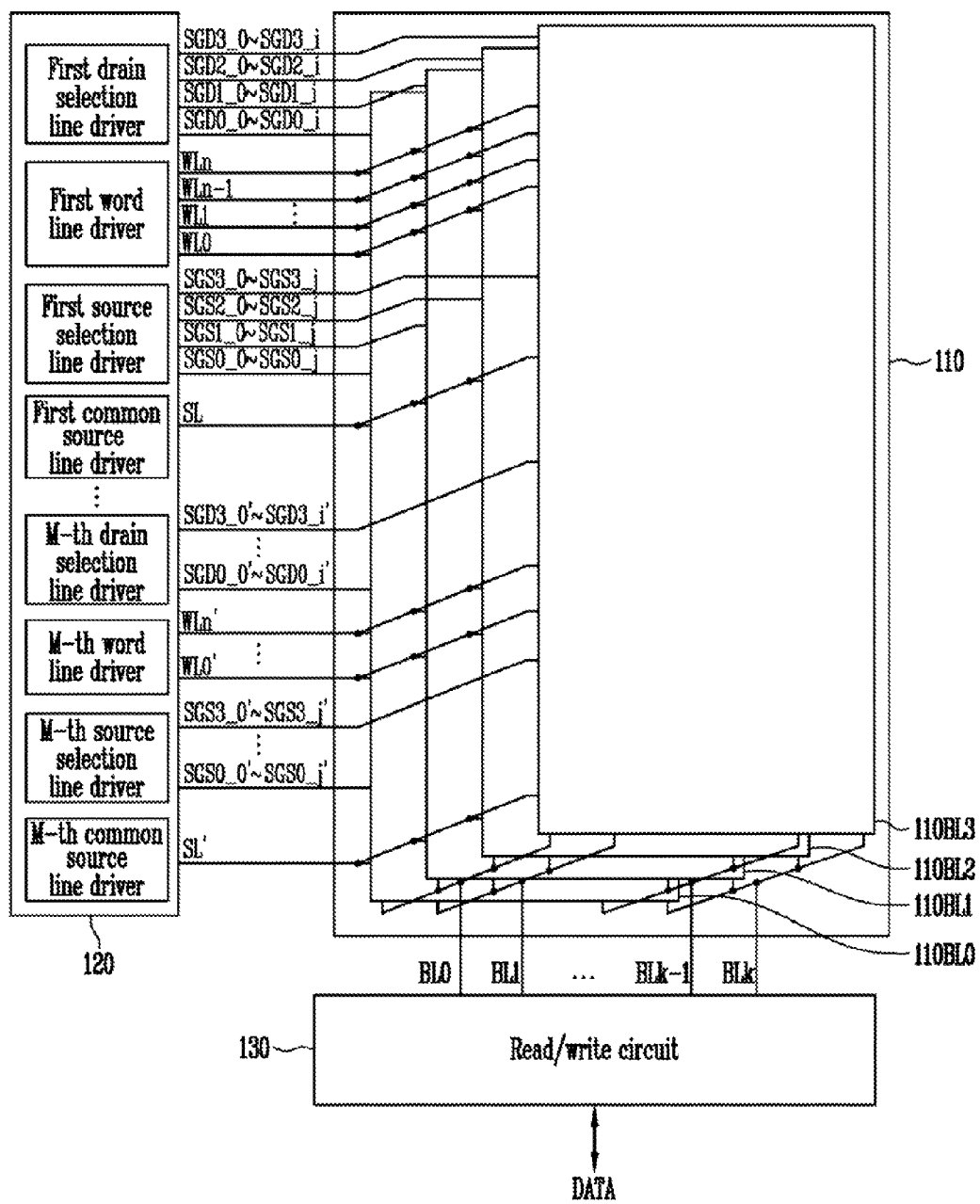
FIG. 1 is a block diagram illustrating a semiconductor memory device according to an embodiment of the present invention.

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

FIG. 1 is a block diagram illustrating a semiconductor memory device according to an embodiment of the present invention.

Referring to FIG. 1, a semiconductor memory device may include a memory array 110 and operation circuits 120 and 130. The operation circuits may include a voltage supply circuit 120 and a read/write circuit 130.

The memory array 110 may include a plurality of memory block layers 110BL0 to 110BL3 that are stacked over a substrate. Each of the memory block layers 110BL0 to 110BL3 may include memory blocks arranged in a direction horizontal to the substrate. These memory blocks may be arranged in a predetermined direction, for example, a bit line direction. Each of the memory blocks may include memory strings coupled between bit lines and common source lines. The bit lines and the common source lines may extend in a direction crossing each other. The structure of the memory string will be described below in detail.

Figure 2:
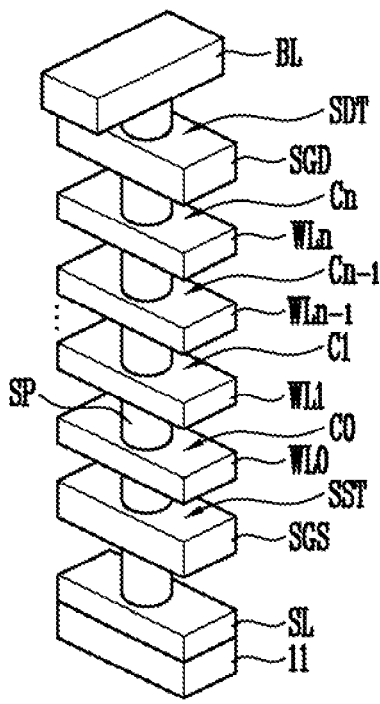
FIG. 2 is a three-dimensional view illustrating a memory string included in a memory array shown in FIG. 1.

FIG. 2 is a three-dimensional view illustrating one of the memory strings included in the memory array shown in FIG. 1.

Figure 3:
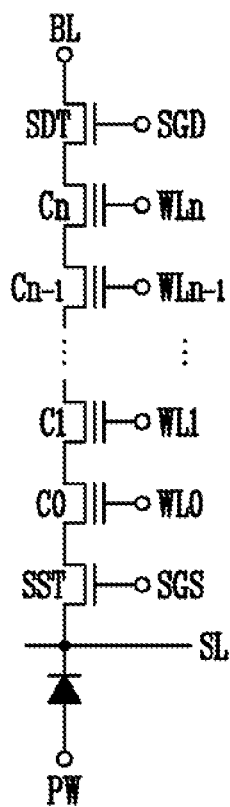
FIG. 3 is a three-dimensional view illustrating a memory string included in the memory array shown in FIG. 1.

FIG. 3 is a circuit diagram illustrating one of the memory strings included in the memory array shown in FIG. 1.

Referring to FIGS. 2 and 3, a common source line SL may be formed on a semiconductor substrate in which a P well PW is formed. A vertical channel layer SP may be formed on the common source line SL. A bit line BL may be coupled to a top portion of the vertical channel layer SP. The vertical channel layer SP may include polysilicon. A plurality of conductive layers SGS, WL0 to WLn and SGD may surround the vertical channel layer SP at different heights. A multilayer (not illustrated) including a charge storage layer may be formed on a surface of the vertical channel layer SP. The multilayer may be located between the vertical channel layer SP and the conductive layers SGS, WL0 to WLn and SGD.

The lowermost conductive layer may be a source selection line or first selection line SGS, and the uppermost conductive layer may be a drain selection line or second selection line SGD. The other conductive layers, which are interposed between the source and drain selection lines SGS and SGD, may be word lines WL0 to WLn. In other words, the conductive layers SGS, WL0 to WLn and SGD may be stacked over the semiconductor substrate, and the vertical channel layer SP, which is passing through the conductive layers SGS, WL0 to WLn and SGD, may be vertically coupled between the bit line BL and the common source line SL formed on the semiconductor substrate.

A drain selection transistor or second selection transistor SDT may be formed at a position where the uppermost conductive layer SGD surrounds the vertical channel layer SP. A source selection transistor or first selection transistor SST may be formed at a position where the lowermost conductive layer SGS surrounds the vertical channel layer SP. Memory cells C0 to Cn may be formed at positions where the conductive layers WL0 to WLn surround the vertical channel layer SP, respectively.

The memory string of the above-described structure may include the source selection transistor SST, the memory cells C0 to Cn and the drain selection transistor SDT that are coupled in the direction vertical to the substrate between the common source line SL and the bit line BL. The source selection transistor SST may electrically couple the memory cells C0 to Cn to the common source line SL based on a first selection signal applied to the first selection line SGS. The drain selection transistor SDT may electrically couple the memory cells C0 to Cn to the bit line BL based on a second selection signal applied to the second selection line SGD.

Figure 4A:
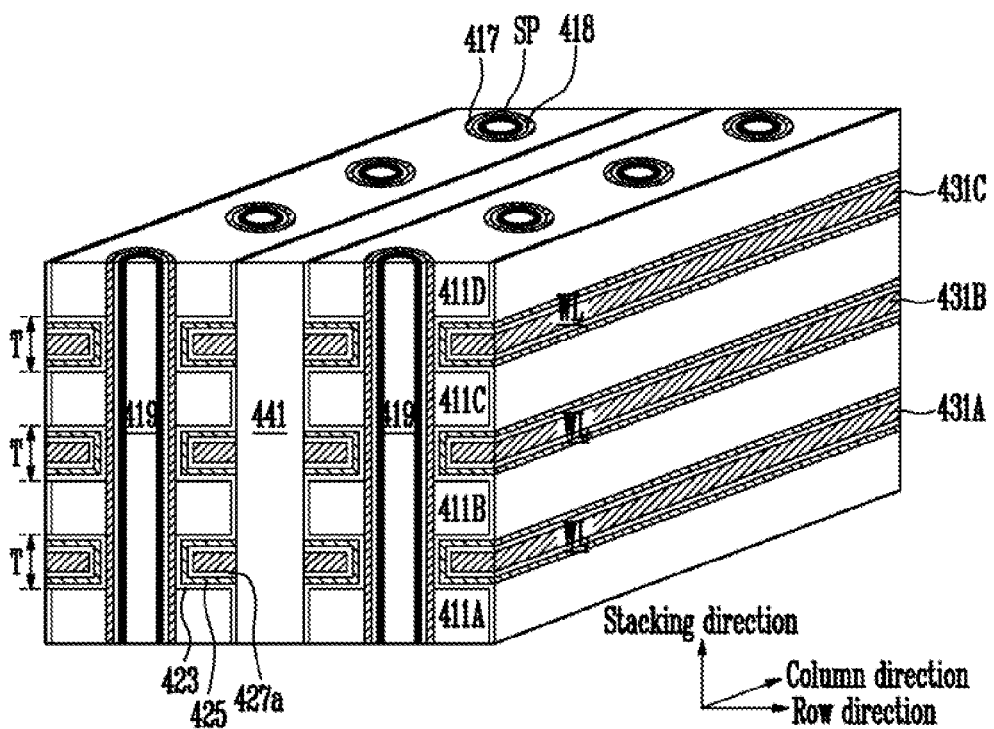
FIGS. 4A to 4C are three-dimensional views illustrating the structure of a memory cell of the memory string shown in FIG. 2.
Figure 4B:
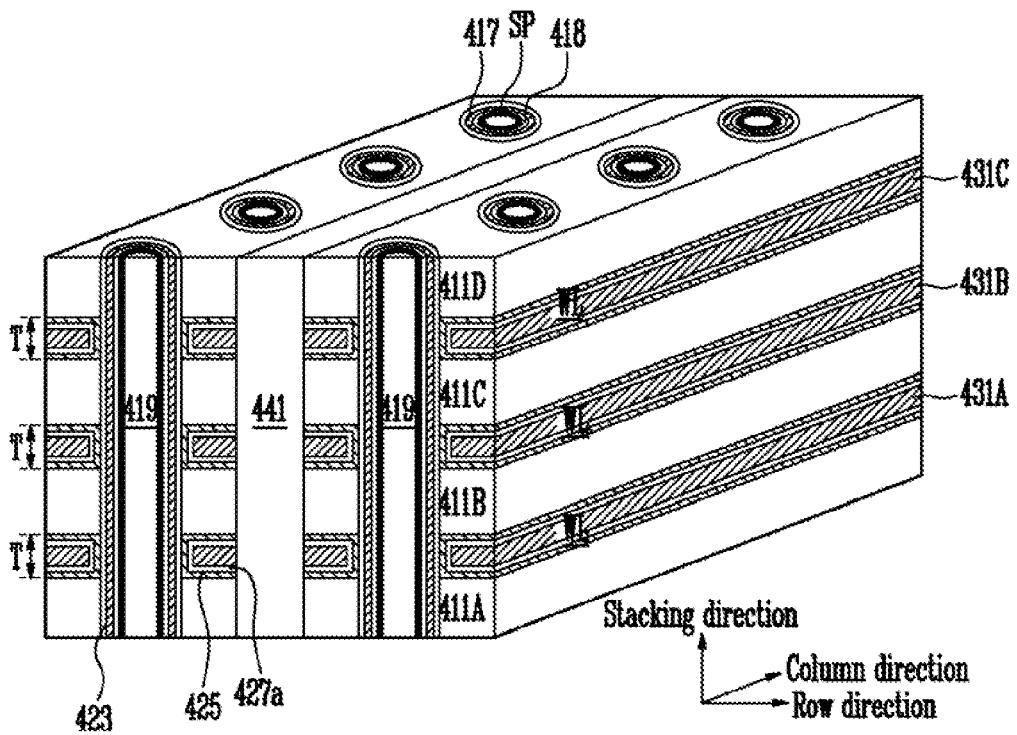
Figure 4C:
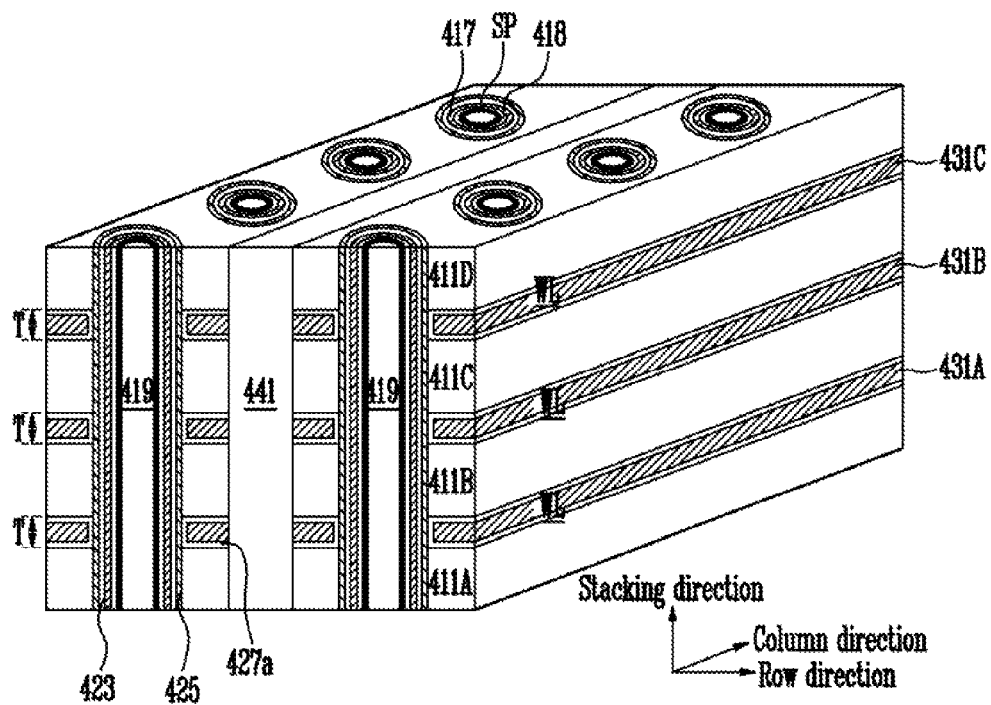

FIGS. 4A to 4C are three-dimensional views illustrating the structure of one of the memory cells of the memory string shown in FIG. 2.

Referring to FIGS. 4A to 4C, a three-dimensional memory device according to embodiments of the present invention may include vertical channel layers SP. The vertical channel layers SP may protrude from the substrate (not illustrated) and form a matrix including a plurality of rows and a plurality of columns. Each of the vertical channel layers SP may be a tubular shape having a central portion filled with an insulating layer 419 or a pillar shape having a surface and a central portion filled with a semiconductor material layer.

Each of the vertical channel layers SP may be surrounded by a plurality of interlayer insulating layers 411A to 411D and a plurality of conductive layers 431A to 431C that are stacked alternately with each other. The plurality of interlayer insulating layers 411A to 411D and the plurality of conductive layers 431A to 431C may be formed between the vertical channel layers SP adjacent to each other in a column direction and may be separated by an insulating layer 441. The insulating layer 441 may pass through the interlayer insulating layer 411A to 411D and may extend in the column direction.

The conductive layers 431A to 431C may be formed in trenches T between the interlayer insulating layer 411A to 411D that are adjacent to each other and may be separated by the trenches T. The trenches T may refer to space in which word lines WL are formed.

The conductive layers 431A to 431C may be surrounded by barrier metal patterns 427a. Each of the barrier metal patterns 427a may be formed in each of the trenches T and separated by each of the trenches T.

A charge blocking layer 423 may be interposed between the vertical channel layers SP and the barrier metal patterns 427a. A diffusion barrier layer 425 may be interposed between the barrier metal patterns 427a and the charge blocking layer 423. In addition, a charge storage layer 417 may be interposed between the charge blocking layer 423 and the vertical channel layer SP. A tunnel insulating layer 418 may be interposed between the charge storage layer 417 and the vertical channel layer SP.

The charge storage layer 417 and the tunnel insulating layer 418 may surround an outer wall of the vertical channel layer SP.

As illustrated in FIG. 4A, the charge blocking layer 423 may be formed along surfaces of the trenches T and surround the barrier metal patterns 427a. Alternately, as illustrated in FIGS. 4B and 4C, the charge blocking layer 423 may surround the outer wall of the vertical channel layer SP.

As illustrated in FIGS. 4A and 4B, the diffusion barrier layer 425 may be formed along the surfaces of the trenches T and may surround the barrier metal patterns 427a. Alternatively, when the diffusion barrier layer 425 is an insulating layer, as illustrated in FIG. 4C, the diffusion barrier layer 425 may surround the outer wall of the vertical channel layer SP.

The conductive layers 431A to 431C and the barrier metal patterns 427a that are formed in the trenches T may function as the word lines WL. Memory cell transistors may be defined at Intersections between the word lines WL and the vertical channel layer SP. The memory cell transistors of the above-described structure according to an embodiment of the present invention may be stacked along the vertical channel layer SP and arranged in three dimensions.

Each of the conductive layers 431A to 431C may include a polysilicon layer or a material layer having a lower resistance and having a higher work function than the polysilicon layer. For example, each of the conductive layers 431A to 431C may include tungsten. When each of the conductive layers 431A to 431C includes a material layer having a high work function, back tunneling of charges toward the charge storage layer through the charge blocking layer 423 may be reduced and may improve retention characteristics of memory cells.

The barrier metal pattern 427a may include a material for preventing reactions between the conductive layers 431A to 431C of a high work function and the charge blocking layer 423. In addition, the barrier metal pattern 427a may include a material layer having a high work function in order to reduce a back tunneling phenomenon.

Figure 5:
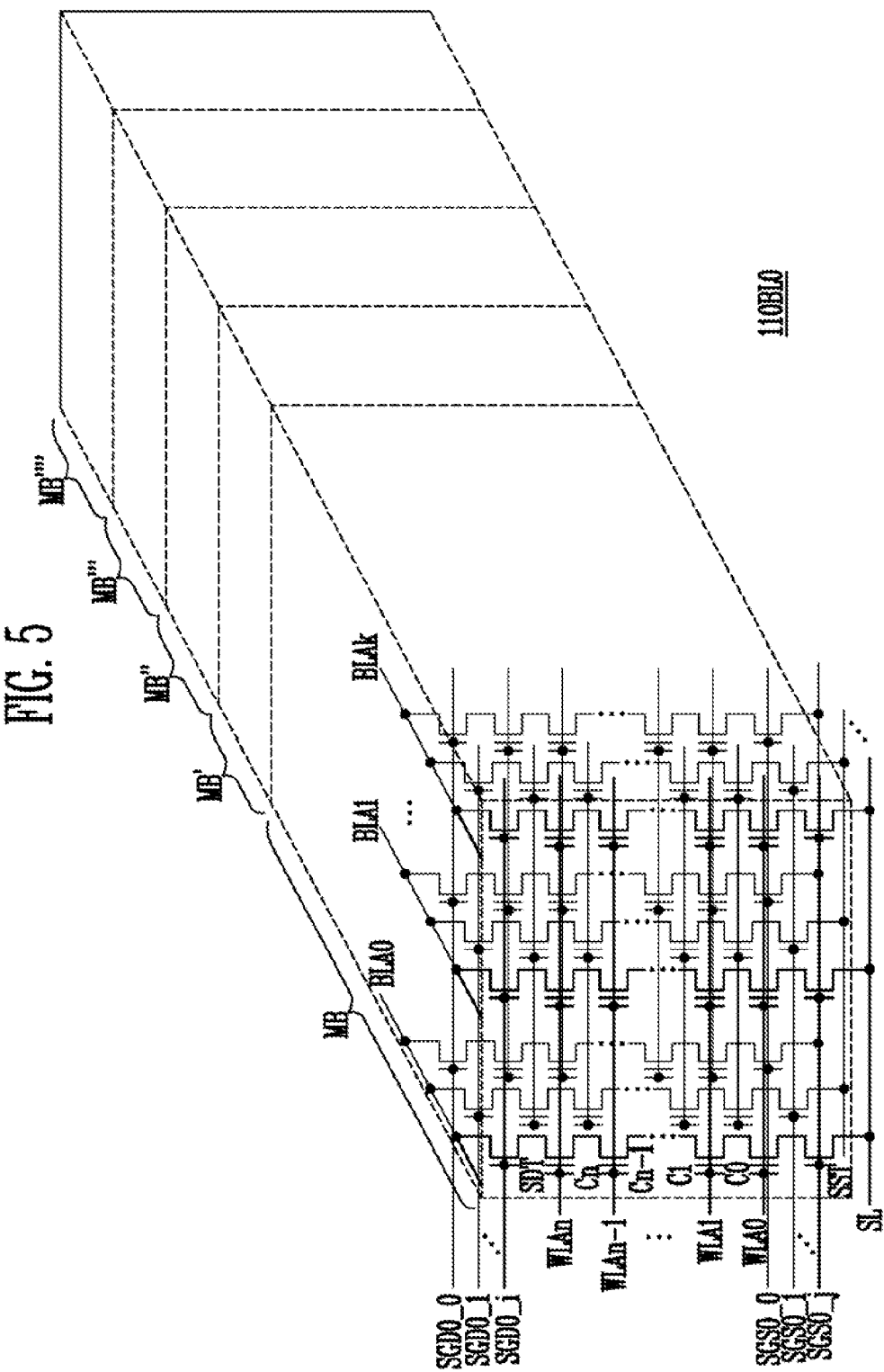
FIG. 5 is a circuit diagram illustrating a memory block layer included in the memory array shown in FIG. 1.

FIG. 5 is a circuit diagram illustrating one of the memory block layers included in the memory array shown in FIG. 1.

Referring to FIG. 5, the memory block layer 110BL0 may include a plurality of memory blocks that are arranged in the direction horizontal to the substrate. In FIG. 5, five memory blocks are shown for illustrative purposes. Each of the memory blocks, for example, a memory block MB may include memory strings coupled between bit lines BLA0 to BLAk and the common source lines SL. In FIG. 5, three bit lines are shown for illustrative purposes. In the memory block layer 110BL0, the memory blocks may share the bit lines BLA0 to BLAk, and the common source lines SL of the memory blocks may be separated from each other. The bit lines BLA0 to BLAk may extend in a direction in parallel with the horizontal direction in which the memory blocks MB are arranged.

In each of the memory blocks MB, the plurality of memory strings may be coupled to each of the bit lines BLA0 to BLAk, and the plurality of memory strings may be coupled to each of the common source lines SL. Each of the memory strings may include the first selection transistor or source selection transistor SST, the second selection transistor or drain selection transistor SDT and the memory cells C0 to Cn. The first selection transistor or source selection transistor SST may be coupled to the common source line SL. The second selection transistor or drain selection transistor SDT may be coupled to the bit line BLA0. The memory cells C0 to Cn may be vertically coupled in series between the first and second selection transistors SST and SDT.

The memory cells C0 to Cn included in each of the memory strings in the memory block MB may share word lines WLA0 to WLAn. Thus, the word lines WLA0 to WLAn of the memory cells C0 to Cn included in each of the memory strings may be coupled to each other. In other words, in the memory block MB, word lines of memory cells that are formed in the same layer and adjacent to each other in the horizontal direction may be coupled to each other.

In the memory block MB, the drain selection transistors SDT of the memory strings, which are coupled to the bit lines BLA0 to BLAk, may share the same drain selection line, for example, SGD0_0. In other words, gates of the drain selection transistors SDT of the memory strings coupled to the bit lines BLA0 to BLAk may be coupled to each other. The drain selection transistors SDT of the memory strings, which are coupled to the same bit line, for example, BLA0, in the memory block MB may have drain selection lines SGD0_0 to SGD0_$i$, respectively. In other words, the drain selection lines SGD0_0 to SGD0_$i$ of the drain selection transistors SDT of the memory strings, which are coupled to the same bit line BLA0, may be separated from each other. Thus, the drain selection transistors SDT coupled to the same bit line BLA0 may be independently operated by different operating voltages. The drain selection lines SGD0_0 to SGD0_$i$ may extend in a direction crossing the bit lines BLA0 to BLAk.

The source selection transistors SST of the memory strings coupled to the bit lines BLA0 to BLAk in the memory block MB may share a source selection line, for example, SGS0_0. In other words, gates of the source selection transistors SST of the memory strings, which are coupled to the bit lines BLA0 to BLAk may be coupled to each other. However, the source selection transistors SST of the memory strings, which are coupled to the same bit line, for example, BLA0, in the memory block MB may have different source selection lines SGS0_0 to SGS0_$i$. In other words, the source selection lines SGS0_0 to SGS0_$i$ of the source selection transistors SST of the memory strings, which are coupled to the same bit line BLA0, may be separated from each other. Thus, the source selection transistors SST coupled to the same bit line BLA0 may be independently operated by different operating voltages. The source selection lines SGS0_0 to SGS0_$i$ may extend in a direction crossing the bit lines BLA0 to BLAk. However, according to memory cell design, all the source selection lines SGS0_0 to SGS0_$i$ may be coupled to each other in the memory block MB. In addition, operating voltages applied to the memory blocks during a read operation, a program operation and an erase operation may vary according to a coupling state of the source selection lines SGS0_0 to SGS0_$i$ and a separated state of the common source lines SL in the memory block MB.

The source selection lines SGS0_0 to SGS0_$i$, the word lines WLA0 to WLAn, the drain selection lines SGD0_0 to SGD0_$i$ and the common source lines SL of the memory block MB in the memory block layer 110BL0 may be separated from source selection lines (not illustrated), word lines (not illustrated), drain selection lines (not illustrated) and common source lines (not illustrated) of the other memory blocks. In other words, in the memory block layer 110BL0, the source selection lines SGS0_0 to SGS0_$i$, the word lines WLA0 to WLAn, the drain selection lines SGD0_0 to SGD0_$i$ and the common source lines SL of each of the memory blocks MB may be separated from those of the other memory blocks.

Figure 6:
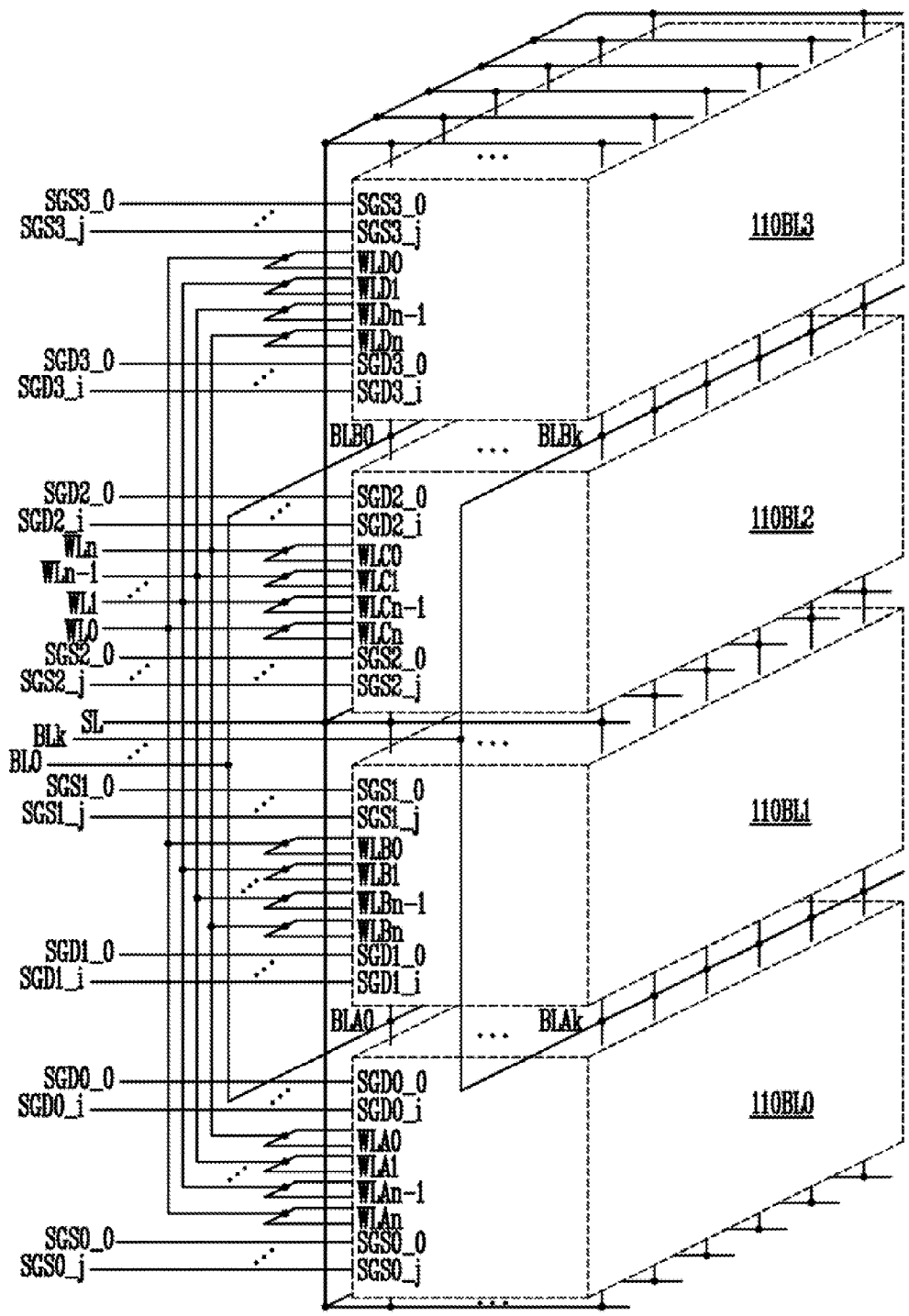
FIG. 6 is a block diagram illustrating a memory array shown in FIG. 1.

FIG. 6 is a block diagram illustrating the memory array shown in FIG. 1.

Figure 7:
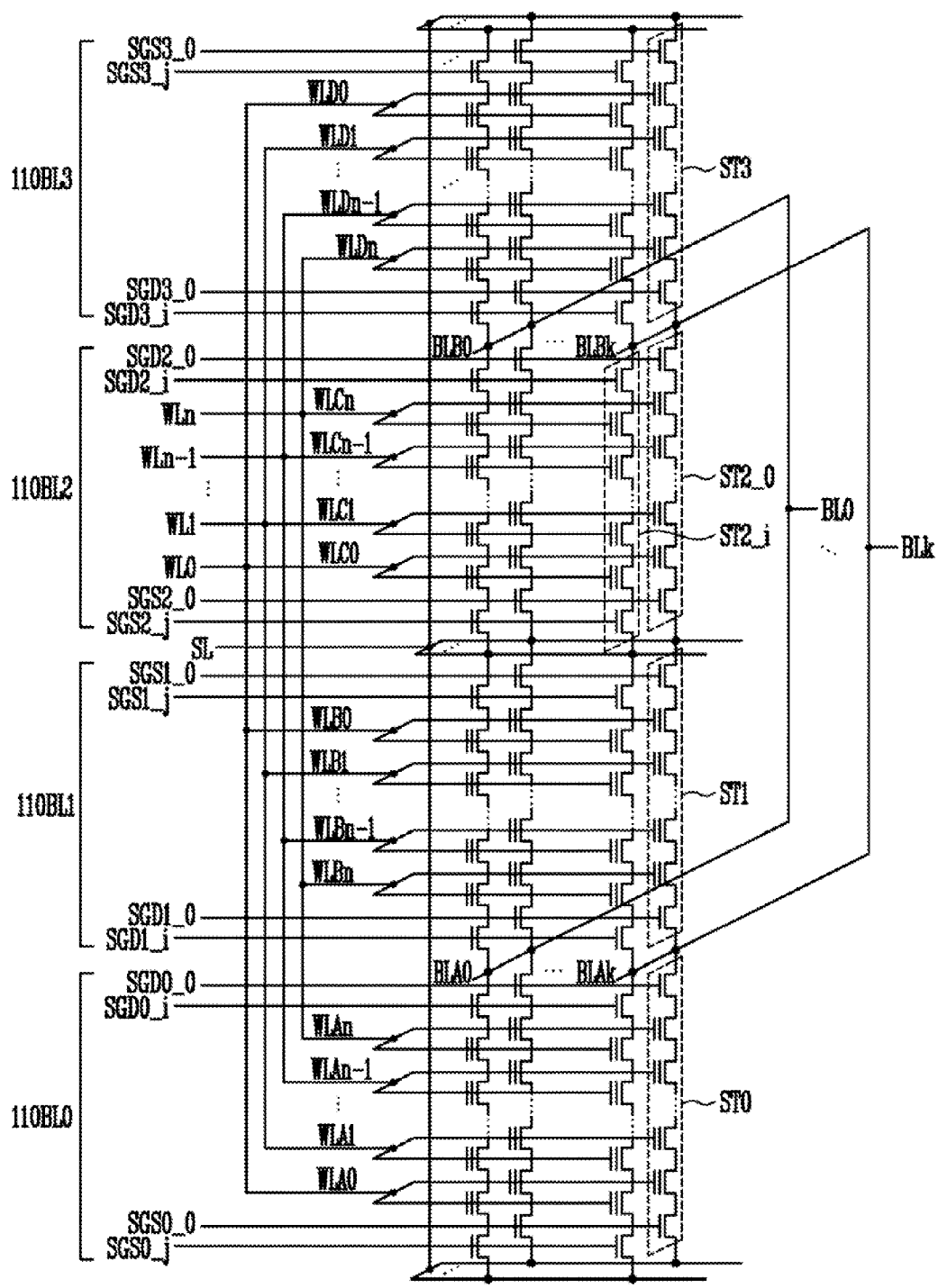
FIG. 7 is a circuit diagram illustrating a memory array shown in FIG. 1.

FIG. 7 is a circuit diagram illustrating the memory array shown in FIG. 1.

Referring to FIGS. 6 and 7, at least two of the memory block layers, which is described above with reference to FIG. 5, may be stacked upon one another. In a preferred embodiment, the memory block layers 110BL0 to 110BL3 may be stacked.

Memory blocks or memory strings included in an odd-numbered memory block layer 110BL0 and 110BL2 and memory blocks or memory strings included in an even-numbered memory block layer 110BL1 or 110BL3 may share the bit lines BLA0 to BLAk and BLB0 to BLBk and the common source line SL respectively. For example, the lowermost memory block layer 110BL0 and the memory block layer 110BL1 located on the lowermost memory block layer 110BL0 may share the first lower bit lines BLA0 to BLAk, and the uppermost memory block layer 110BL3 and the memory block layer 110BL2 located under the uppermost memory block layer 110BL3 may share the first upper bit lines BLB0 to BLBk.

More specifically, for example, the odd-numbered memory block layer 110BL2 may share the bit lines BLB0 to BLBk with the even-numbered memory block layer 110BL3 and may share the common source lines SL with the even-numbered memory block layer 110BL1. In addition, for example, the even-numbered memory block layer 110BL1 may share the common source lines SL with the odd-numbered memory block layer 110BL2 stacked thereon and may share the bit lines BLA0 to BLAk with the odd-numbered memory block layer 110BL0 stacked thereunder. The bit lines BLA0 to BLAk and bit lines BLB0 to BLBk may be formed in different layers, and the common source lines SL may be formed in different layers.

As described above, in order for the memory block layers 110BL0 to 110BL3 to share the bit lines BLA0 to BLAk and BLB0 to BLBk and the common source lines SL, the memory block layers may be stacked so that the memory blocks, which are included in the odd-numbered memory block layers 110BL0 and 110BL2, and the memory blocks, which are included in the even-numbered memory block layers 110BL1 and 110BL3, may have vertical symmetry.

The lower bit lines BLA0 to BLAk and the upper bit lines BLB0 to BLBk may be coupled to each other by vertical lines at outer edges or at the center of the memory array, which is described below in detail.

The memory block layers 110BL0 to 110BL3 may share the word lines WLA0 to WLAn. In other words, the word lines WLA0 to WLAn of the memory block layers 110BL0 to 110BL3 may be vertically coupled with each other. More specifically, the word lines WLA0 to WLAn of the first memory blocks, which are included in the memory block layers 110BL0 to 110BL4, may be vertically coupled to each other. In addition, word lines of the last memory blocks, which are included in the memory block layers 110BL0 to 110BL3, may be vertically coupled to each other. In other words, word lines of different memory blocks may be coupled to each other in the vertical direction, but not in the horizontal direction.

The memory block layers 110BL0 to 110BL3 may share the common source lines SL. In other word, the common source lines SL of the memory block layers 110BL0 to 110BL3 may be vertically coupled to each other. Similar to the word lines WLA0 to WLAn, common source lines of different memory blocks may be coupled to each other in the vertical direction, but not in the horizontal direction.

Source selection lines SGS0_0 to SGS0_$j$, SGS1_0 to SGS1_$j$, SGS2_0 to SGS2_$j$ and SGS3_0 to SGS3_$j$ of the memory block layers 110BL0 to 110BL3 may be separated from each other. More specifically, source selection lines of memory blocks horizontally or vertically adjacent to each other may not be coupled to each other. Drain selection lines SGD0_0 to SGD0_$i$, SGD1_0 to SGD1_$i$, SGD2_0 to SGD2_$i$ and SGD3_0 to SGD3_$i$ of the memory block layers 110BL0 to 110BL3 may be separated from each other. More specifically, drain selection lines of different memory blocks horizontally or vertically adjacent to each other may not be coupled to each other. As described above, word lines, bit lines and common source lines may be vertically coupled to each other, while selection lines may be vertically separated from each other.

Referring again to FIG. 1, the voltage supply circuit 120 may apply operating voltages to the memory blocks for data input and output operations of a selected memory block among memory blocks, such as a read operation, a program operation or an erase operation. The voltage supply circuit 120 may apply a read voltage to a selected word line of selected memory cells during a read operation and a read pass voltage to unselected word lines of unselected memory cells. In addition, the voltage supply circuit 120 may apply a program voltage to a selected word line of selected memory cells during a program operation and a program pass voltage to unselected word lines of unselected memory cells. In addition, the voltage supply circuit 120 may apply a negative voltage of, for example, −10V to the word lines WL0 to WLn of the memory cells during an erase operation.

Operating voltages applied to the selected memory block may also be applied to unselected memory blocks located thereon or thereunder through the word lines WL0 to WLn, the common source line SL and the bit lines BLA0 to BLAk and BLB0 to BLBk. Therefore, the read operation, the program operation or the erase operation may be performed to only the selected memory block. As for the unselected memory block, in order to reduce interference or disturbance, the voltage supply circuit 120 may independently control operating voltages applied to the drain selection lines SGD0_0 to SGD0_$i$, SGD1_0 to SGD1_$i$, SGD2_0 to SGD2_$i$ and SGD3_0 to SGD3_$i$ according to each layer, and may independently control operating voltages applied to the source selection lines SGS0_0 to SGS_$i$, SGS1_0 to SGS1_$i$, SGS2_0 to SGS2_$i$ and SGS3_0 to SGS3_$i$.

The voltage supply circuit 120 may include drain selection line drivers, word line drivers, source selection line drivers and a common source line driver. A first drain selection line driver, a first word line driver and a first source selection line driver may form a single driver group. The single driver group may control each of the operating voltages applied to the word lines WL0 to WLn and the selection lines SGD0_0 to SGD0_$i$, SGD1_0 to SGD1_1, SGD2_0 to SGD2_$i$, SGD3_0 to SGD3_$i$, SGS0_0 to SGS_$i$, SGS1_0 to SGS1_$i$, SGS2_0 to SGS2_$i$ and SGS3_0 to SGS3_$i$, which are shared by the memory blocks included in each of the memory block layers 110BL0 to 110BL3. In other words, the number of driver groups may correspond to the number of memory blocks included in each of the memory block layers.

Referring to FIG. 1, the read/write circuit 130 may be coupled to the memory blocks, which are included in the memory block layers 110BL0 to 110B3, through the bit lines BLA0 to BLAk and BLB0 to BLBk. In addition, the read/write circuit 130 may selectively precharge or discharge the selected bit lines BLA0 to BLAk and BLB0 to BLBk based on data stored in the memory cells during the program operation. The read/write circuit 130 may sense voltage variations or current variations of the selected bit lines BLA0 to BLAk and BLB0 to BLBk during a read operation and latch the data stored in the memory cells. The read/write circuit 130 may include a page buffer.

Hereinafter, embodiments of a method of coupling upper bit lines and lower bit lines and operating voltages applied to memory blocks are described below.

FIGS. 8 to 10, 11A and 11B are views illustrating a coupling structure and operations of a semiconductor memory device according to embodiments of the present invention.

Figure 8:
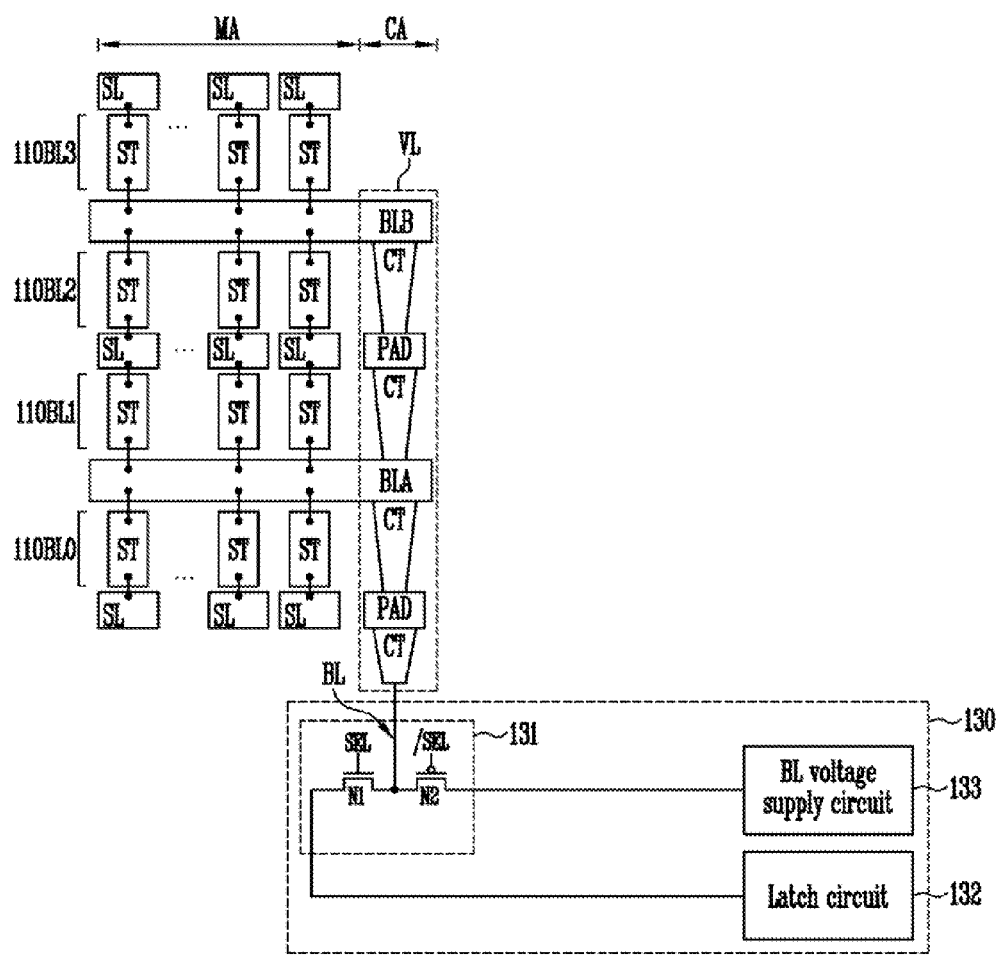
FIGS. 8 to 10, 11A and 11B are views illustrating a connection structure and operations of a semiconductor memory device according to embodiments of the present invention.

Referring to FIG. 8, a lower bit line BLA, which is shared by the first and second memory block layers 110BL0 and 110BL1, and an upper bit line BLB, which is shared by the third and fourth memory block layers 110BL2 and 110BL3, may be coupled by a vertical line VL. The vertical line VL may include contact plugs CT and contact pads PAD. The contact plugs CT may be formed in the same layers as memory strings ST, and the contact pads PAD may be formed in the same layer as the common source lines SL. Some of the contact plugs CT and the contact pads PAD may be formed between the upper bit line BLB and the lower bit line BLA and couple the upper bit line BLB and the lower bit line BLA. The remainder of the contact plugs CT and the contact pads PAD may be formed between the lower bit line BLA and the substrate and may function to electrically couple the lower bit line BLA and the read/write circuit 130. The upper bit line BLB and the lower bit line BLA may be coupled to the same read/write circuit 130 by the vertical line VL.

The vertical line VL may be formed in a contact region CA that is defined at the edge of a memory array MA. The vertical connection structure of the vertical line VL that connects the upper bit line BLB, the lower bit line BLA and the substrate may reduce the contact region CA, which may reduce a chip size.

The read/write circuit 130 may include a bit line switching circuit 131, a latch circuit 132 and a BL voltage supply circuit 133. The bit line switching circuit 131 may include a transistor N1 and a transistor N2. The transistor N1 may operate based on a bit line selection signal SEL, and the second transistor N2 may operate based on an inverted bit line selection signal /SEL. Based on the bit line selection signal SEL and the inverted bit line selection signal /SEL, the bit line switching circuit 131 may couple the bit line BL to the latch circuit 132 when the bit line BL is selected and may couple the bit line BL to the BL voltage supply circuit 133 when the bit line BL is not selected. When the bit line BL is coupled to the latch circuit 132, a program operation or a read operation may be performed.

When the bit line BL is coupled to the BL voltage supply circuit 133, the BL voltage supply circuit 133 may apply a program inhibit voltage, for example, power voltage to the bit line BL during a program operation and may apply a ground voltage, for example, 0V or a precharge voltage during a read operation.

When the bit lines BLA and BLB are coupled according to the embodiments, the voltage supply circuit 120 and the read/write circuit 130 may apply operating voltages during a read operation, a program operation and an erase operation as shown below in Table 1-1 to Table 1-9.

TABLE 1-1

Memory string(ST0) of $1^{st}$ layer M/B (110BL0)
(Sharing SL & BL & WL with ST2_0)

|  | Read | Program | Erase |
|---|---|---|---|
| BL0 | 1 V | Vcc -> 0 V/Vcc | Floating |
| SGD0_0 | 4 V | 5 V -> 0 V or −2 V | 0 V |
| WLn | Vpass_read | Vpass_pgm | −10 V |
| ... | Vpass_read | Vpass_pgm | −10 V |
| SEL_WL | Vread | Vpgm | −10 V |
| ... | Vpass_read | Vpass_pgm | −10 V |
| WL0 | Vpass_read | Vpass_pgm | −10 V |
| SGS0_0 | 0 V | 0 V of −2 V | 0 V or −2 V |
| SL | 0 V | Vcc | Verase(8 V) |

TABLE 1-2

$1^{st}$ layer unselected Memory block
(sharing BL with 110BL2)

|  | Read | Program | Erase |
|---|---|---|---|
| BL0 | 1 V | Vcc -> 0 V/Vcc | Floating |
| SGD0_0' | 0 V | 0 V or −2 V | 0 V |
| WLn' | 0 V | 0 V | 0 V |
| ... | 0 V | 0 V | 0 V |

TABLE 1-2-continued $1^{st}$ layer unselected Memory block
(sharing BL with 110BL2)

|  | Read | Program | Erase |
|---|---|---|---|
| WL' | 0 V | 0 V | 0 V |
| ... | 0 V | 0 V | 0 V |
| WL0' | 0 V | 0 V | 0 V |
| SGS0_0' | 0 V | 0 V | 0 V |
| SL' | 0 V | 0 V | 0 V |

TABLE 1-3 memory string(ST1) of $2^{nd}$ layer M/B (110BL1)
(Sharing SL & BL & WL with ST2_0)

|  | Read | Program | Erase |
|---|---|---|---|
| BL0 | 1 V | Vcc -> 0 V/Vcc | Floating |
| SGD1_0 | 4 V | 5 V -> 0 V or −2 V | 0 V |
| WLn | Vpass_read | Vpass_pgm | −10 V |
| ... | Vpass_read | Vpass_pgm | −10 V |
| SEL_WL | Vread | Vpgm | −10 V |
| ... | Vpass_read | Vpass_pgm | −10 V |
| WL0 | Vpass_read | Vpass_pgm | −10 V |
| SGS1_0 | 0 V | 0 V or −2 V | 0 V or −2 V |
| SL | 0 V | Vcc | Verase(8 V) |

TABLE 1-4

|  |  | Read | Program | Erase |
|---|---|---|---|---|
| $2^{nd}$ layer unselected Memory block (sharing BL with 110BL2) | BL0 | 1 V | Vcc -> 0 V/Vcc | Floating |
|  | SGD1_0' | 0 V | 0 V or −2 V | 0 V |
|  | WLn' | 0 V | 0 V | 0 V |
|  | ... | 0 V | 0 V | 0 V |
|  | WL' | 0 V | 0 V | 0 V |
|  | ... | 0 V | 0 V | 0 V |
|  | WL0' | 0 V | 0 V | 0 V |
|  | SGS1_0' | 0 V | 0 V | 0 V |
|  | SL' | 0 V | 0 V | 0 V |

TABLE 1-5

|  |  |  | Read | Program | Erase |
|---|---|---|---|---|---|
| memory string(ST2_i) of $3^{rd}$ layer M/B (110BL2) | (Sharing SL & WL with ST2_0) | BLk | 1 V | Vcc -> 0 V/Vcc | Floating |
|  |  | SGD2_i | 0 V | 5 V -> 0 V or −2 V | 0 V |
|  |  | WLn | Vpass_read | Vpass_pgm | −10 V |
|  |  | ... | Vpass_read | Vpass_pgm | −10 V |
|  |  | SEL_WL | Vread | Vpgm | −10 V |
|  |  | ... | Vpass_read | Vpass_pgm | −10 V |
|  |  | WL0 | Vpass_read | Vpass_pgm | −10 V |
|  |  | SGS2_i | 4 V | 0 V or −2 V | Verase(8 V) |
|  |  | SL | 0 V | Vcc | Verase(8 V) |

TABLE 1-6

|  |  |  | Read | Program | Erase |
|---|---|---|---|---|---|
| memory string(ST2_0) of $3^{rd}$ layer M/B (110BL2) | (Selected) | BL0 | 1 V | Vcc -> 0 V/Vcc | Floating |
|  |  | SGD2_0 | 4 V | 5 V -> 1.5 V | 0 V |
|  |  | WLn | Vpass_read | Vpass_pgm | −10 V |
|  |  | ... | Vpass_read | Vpass_pgm | −10 V |
|  |  | SEL_WL | Vread | Vpgm | −10 V |
|  |  | ... | Vpass_read | Vpass_pgm | −10 V |
|  |  | WL0 | Vpass_read | Vpass_pgm | −10 V |
|  |  | SGS2_0 | 4 V | 0 V or −2 V | Verase(8 V) |
|  |  | SL | 0 V | Vcc | Verase(8 V) |

TABLE 1-7

|  |  | Read | Program | Erase |
|---|---|---|---|---|
| $3^{rd}$ layer unselected memory block (sharing BL with 110BL2) | BL0 | 1 V | Vcc -> 0 V/Vcc | Floating |
| | SGD2_0' | 0 V | 0 V or -2 V | 0 V |
| | WLn' | 0 V | 0 V | 0 V |
| | ... | 0 V | 0 V | 0 V |
| | WL' | 0 V | 0 V | 0 V |
| | ... | 0 V | 0 V | 0 V |
| | WL0' | 0 V | 0 V | 0 V |
| | SGS2_0' | 0 V | 0 V | 0 V |
| | SL' | 0 V | 0 V | 0 V |

TABLE 1-8

|  |  |  | Read | Program | Erase |
|---|---|---|---|---|---|
| memory string(ST3) of $4^{th}$ layer M/B (110BL3) | (Sharing SL & BL & WL with ST2_0) | BL0 | 1 V | Vcc -> 0 V/Vcc | Floating |
| | | SGD3_0 | 4 V | 5 V -> 0 V or -2 V | 0 V |
| | | WLn | Vpass_read | Vpass_pgm | -10 V |
| | | ... | Vpass_read | Vpass_pgm | -10 V |
| | | SEL_WL | Vread | Vpgm | -10 V |
| | | ... | Vpass_read | Vpass_pgm | -10 V |
| | | WL0 | Vpass_read | Vpass_pgm | -10 V |
| | | SGS3_0 | 0 V | 0 V or -2 V | 0 V or -2 V |
| | | SL | 0 V | Vcc | Verase(8 V) |

TABLE 1-9

|  |  | Read | Program | Erase |
|---|---|---|---|---|
| $4^{th}$ layer unselected Memory block (Sharing BL with 110BL2) | BL0 | 1 V | Vcc -> 0 V/Vcc | Floating |
| | SGD3_0' | 0 V | 0 V or -2 V | 0 V |
| | WLn' | 0 V | 0 V | 0 V |
| | ... | 0 V | 0 V | 0 V |
| | WL' | 0 V | 0 V | 0 V |
| | ... | 0 V | 0 V | 0 V |
| | WL0 | 0 V | 0 V | 0 V |
| | SGS3_0' | 0 V | 0 V | 0 V |
| | SL' | 0 V | 0 V | 0 V |

Referring to FIG. 7 and Table 1-1 to Table 1-9, since a selected memory string ST2_0 and unselected memory strings ST0, ST1 and ST3 share the word lines WL0 to WLn, the bit lines BL0 to BLk and the common source line SL, the same operating voltages, for example, a read voltage, a program voltage, a pass voltage, and so forth, may be applied to the memory strings ST0, ST1, ST2_0 and ST3. Different operating voltages may be applied to selection lines in order to block a read operation, a program operation or an erase operation of the unselected memory strings ST0, ST1 and ST3.

For example, in order to block the read operation of the unselected memory strings ST0, ST1 and ST3, a ground voltage may be applied to the source selection lines SGS0_0, SGS1_0 and SGS3_0 of the unselected memory strings ST0, ST1 and ST3. Source selection transistors of the unselected memory strings ST0, ST1 and ST3 may be turned off by the ground voltage, and the unselected memory strings ST0, ST1 and ST3 may be separated from the common source line SL. As a result, the unselected memory strings ST0, ST1 and ST3 may not affect the read operation of the selected memory string ST2_0.

In order to block the program operation of the unselected memory strings ST0, ST1 and ST3, a positive voltage of, for example, 5V may be applied to the drain selection lines SGD0_0, SGD1_0 and SGD3_0 of the unselected memory strings ST0, ST1 and ST3 in order to precharge a channel. Subsequently, a ground voltage of, for example, 0V or a negative voltage of, for example, -2V may be applied thereto. When a pass voltage Vpass_pgm is applied, the drain selection transistor may be turned off and the unselected memory strings ST0, ST1 and ST3 may be separated from the bit line BL0. As a result, the memory cells included in the unselected memory strings ST0, ST1 and ST3 may be program-inhibited.

In order to block the erase operation of the unselected memory strings ST0, ST1 and ST3, a ground voltage of, for example, 0V or a negative voltage of, for example, -2V may be applied to the source selection lines SGS0_0, SGS1_0 and SGS3_0 of the unselected memory strings ST0, ST1 and ST3. As a result, a channel voltage of the unselected memory strings ST0, ST1 and ST3 may be increased by a boosting phenomenon, and the memory cells included in the unselected memory strings ST0, ST1 and ST3 may be erase-inhibited.

Figure 9:
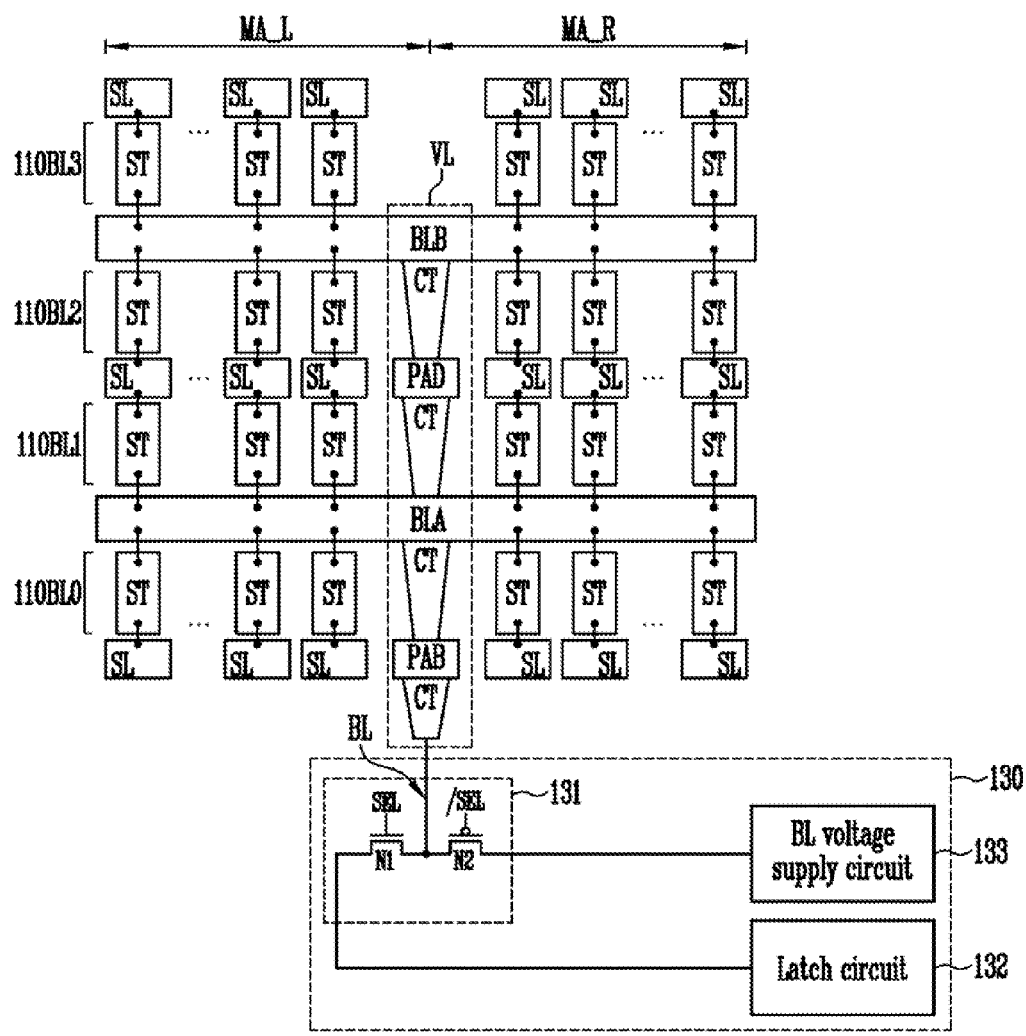

Referring to FIG. 9, the vertical line VL coupling the lower bit line BLA, which is shared by the first and second memory block layers 110BL0 and 110BL1, and the upper bit line BLB, which is shared by the third and fourth memory block layers 110BL2 and 110BL3, may be located at the center of the memory array. In other words, the memory blocks of the memory block layers 110BL0, 110BL1, 110BL2 and 110BL3 may be divided into two memory block groups MA_L and MA_R. The vertical line VL may be formed between the memory block groups MA_L and MA_R in order to vertically couple the bit lines BLA and BLB.

When the bit lines BLA and BLB are coupled according to the embodiments, the voltage supply circuit 120 and the read/write circuit 130 may apply operating voltages during a read operation, a program operation and an erase operation as shown below in Table 2. Different operating voltages may be applied to the selection lines in order to block the read operation, the program operation or the erase operation of the unselected memory strings ST0, ST1 and ST3 as described with reference to FIG. 7, Table 2-1 to Table 2-9 of the first memory block group MA_L and Table 2-10 to Table 2-13 of the second memory block group MA_R.

TABLE 2-1

|  |  |  | Read | Program | Erase |
|---|---|---|---|---|---|
| Memory string(ST0) of 1st layer M/B (110BL0) | (Sharing SL & BL & WL with ST2_0) | BL0 | 1 V | Vcc −> 0 V/Vcc | Floating |
|  |  | SGD0_0 | 4 V | 5 V −> 0 V or −2 V | 0 V |
|  |  | WLn | Vpass_read | Vpass_pgm | −10 V |
|  |  | ... | Vpass_read | Vpass_pgm | −10 V |
|  |  | SEL_WL | Vread | Vpgm | −10 V |
|  |  | ... | Vpass_read | Vpass_pgm | −10 V |
|  |  | WL0 | Vpass_read | Vpass_pgm | −10 V |
|  |  | SGS0_0 | 0 V | 0 V or −2 V | 0 V or −2 V |
|  |  | SL | 0 V | Vcc | Verase(8 V) |

TABLE 2-2

|  |  | Read | Program | Erase |
|---|---|---|---|---|
| 1st layer unselected Memory block (sharing BL with 110BL2) | BL0 | 1 V | Vcc −> 0 V/Vcc | Floating |
|  | SGD0_0' | 0 V | 0 V or −2 V | 0 V |
|  | WLn' | 0 V | 0 V | 0 V |
|  | ... | 0 V | 0 V | 0 V |
|  | SEL_WL' | 0 V | 0 V | 0 V |
|  | ... | 0 V | 0 V | 0 V |
|  | WL0' | 0 V | 0 V | 0 V |
|  | SGS0_0' | 0 V | 0 V | 0 V |
|  | SL' | 0 V | 0 V | 0 V |

TABLE 2-3

|  |  |  | Read | Program | Erase |
|---|---|---|---|---|---|
| memory string(ST1) of 2nd layer M/B (110BL1) | (Sharing SL & BL & WL with ST2_0) | BL0 | 1 V | Vcc −> 0 V/Vcc | Floating |
|  |  | SGD1_0 | 4 V | 5 V −> 0 V or −2 V | 0 V |
|  |  | WLn | Vpass_read | Vpass_pgm | −10 V |
|  |  | ... | Vpass_read | Vpass_pgm | −10 V |
|  |  | SEL_WL | Vread | Vpgm | −10 V |
|  |  | ... | Vpass_read | Vpass_pgm | −10 V |
|  |  | WL0 | Vpass_read | Vpass_pgm | −10 V |
|  |  | SGS1_0 | 0 V | 0 V or −2 V | 0 V or −2 V |
|  |  | SL | 0 V | Vcc | Verase(8 V) |

TABLE 2-4

|  |  | Read | Program | Erase |
|---|---|---|---|---|
| 2nd layer unselected Memory block (sharing BL with 110BL2) | BL0 | 1 V | Vcc −> 0 V/Vcc | Floating |
|  | SGD1_0' | 0 V | 0 V or −2 V | 0 V |
|  | WLn' | 0 V | 0 V | 0 V |
|  | ... | 0 V | 0 V | 0 V |
|  | SEL_WL' | 0 V | 0 V | 0 V |
|  | ... | 0 V | 0 V | 0 V |
|  | WL0' | 0 V | 0 V | 0 V |
|  | SGS1_0' | 0 V | 0 V | 0 V |
|  | SL' | 0 V | 0 V | 0 V |

TABLE 2-5

|  |  |  | Read | Program | Erase |
|---|---|---|---|---|---|
| memory string(ST2_1) of 3rd layer M/B (110BL2) | (Sharing SL & WL with ST2_0) | BLk | 1 V | Vcc −> 0 V/Vcc | Floating |
|  |  | SGD2_0 | 0 V | 5 V −> 0 V or −2 V | 0 V |
|  |  | WLn | Vpass_read | Vpass_pgm | −10 V |
|  |  | ... | Vpass_read | Vpass_pgm | −10 V |
|  |  | SEL_WL | Vread | Vpgm | −10 V |
|  |  | ... | Vpass_read | Vpass_pgm | −10 V |
|  |  | WL0 | Vpass_read | Vpass_pgm | −10 V |
|  |  | SGS2_0 | 4 V | 0 V or −2 V | Verase(8 V) |
|  |  | SL | 0 V | Vcc | Verase(8 V) |

TABLE 2-6

| | | | Read | Program | Erase |
|---|---|---|---|---|---|
| memory string(ST2_0) of 3$^{rd}$ layer M/B (110BL2) | (Selected) | BL0 | 1 V | Vcc –> 0 V/Vcc | Floating |
| | | SGD2_0 | 4 V | 5 V –> 1.5 V | 0 V |
| | | WLn | Vpass_read | Vpass_pgm | −10 V |
| | | . . . | Vpass_read | Vpass_pgm | −10 V |
| | | SEL_WL | Vread | Vpgm | −10 V |
| | | . . . | Vpass_read | Vpass_pgm | −10 V |
| | | WL0 | Vpass_read | Vpass_pgm | −10 V |
| | | SGS2_0 | 4 V | 0 V or −2 V | Verase(8 V) |
| | | SL | 0 V | Vcc | Verase(8 V) |

TABLE 2-7

| | | Read | Program | Erase |
|---|---|---|---|---|
| 3$^{rd}$ layer unselected memory block (sharing BL with 110BL2) | BL0 | 1 V | Vcc –> 0 V/Vcc | Floating |
| | SGD2_0' | 0 V | 0 V or −2 V | 0 V |
| | WLn' | 0 V | 0 V | 0 V |
| | . . . | 0 V | 0 V | 0 V |
| | SEL_WL' | 0 V | 0 V | 0 V |
| | . . . | 0 V | 0 V | 0 V |
| | WL0' | 0 V | 0 V | 0 V |
| | SGS2_0' | 0 V | 0 V | 0 V |
| | SL' | 0 V | 0 V | 0 V |

TABLE 2-8

| | | | Read | Program | Erase |
|---|---|---|---|---|---|
| memory string(ST3) of 4$^{th}$ layer M/B (110BL3) | (Sharing SL & BL & WL with ST2_0) | BL0 | 1 V | Vcc –> 0 V/Vcc | Floating |
| | | SGD3_0 | 4 V | 5 V –> or 0 V or −2 V | 0 V |
| | | WLn | Vpass_read | Vpass_pgm | −10 V |
| | | . . . | Vpass_read | Vpass_pgm | −10 V |
| | | SEL_WL | Vread | Vpgm | −10 V |
| | | . . . | Vpass_read | Vpass_pgm | −10 V |
| | | WL0 | Vpass_read | Vpass_pgm | −10 V |
| | | SGS3_0 | 0 V | 0 V or −2 V | 0 V or −2 V |
| | | SL | 0 V | Vcc | Verase(8 V) |

TABLE 2-9

| | | | Read | Program | Erase |
|---|---|---|---|---|---|
| memory string(ST3) of 4$^{th}$ layer M/B (110BL3) | (Sharing SL & BL & WL with ST2_0) | BL0 | 1 V | Vcc –> 0 V/Vcc | Floating |
| | | SGD3_0 | 4 V | 5 V –> or 0 V or −2 V | 0 V |
| | | WLn | Vpass_read | Vpass_pgm | −10 V |
| | | . . . | Vpass_read | Vpass_pgm | −10 V |
| | | SEL_WL | Vread | Vpgm | −10 V |
| | | . . . | Vpass_read | Vpass_pgm | −10 V |
| | | WL0 | Vpass_read | Vpass_pgm | −10 V |
| | | SGS3_0 | 0 V | 0 V or −2 V | 0 V or −2 V |
| | | SL | 0 V | Vcc | Verase(8 V) |

TABLE 2-10

| | | Read | Program | Erase |
|---|---|---|---|---|
| 1$^{st}$ layer unselected Memory block (sharing BL with 110BL2) | BL0 | 1 V | Vcc –> 0 V/Vcc | Floating |
| | SGD0_0''' | 0 V | 0 V or −2 V | 0 V |
| | WLn''' | 0 V | 0 V | 0 V |
| | . . . | 0 V | 0 V | 0 V |
| | SEL_WL''' | 0 V | 0 V | 0 V |
| | . . . | 0 V | 0 V | 0 V |
| | WL0''' | 0 V | 0 V | 0 V |
| | SG0_0''' | 0 V | 0 V | 0 V |
| | SL''' | 0 V | 0 V | 0 V |

TABLE 2-11

| | | Read | Program | Erase |
|---|---|---|---|---|
| 2$^{nd}$ layer unselected Memory block (sharing BL with 110BL2) | BL0 | 1 V | Vcc –> 0 V/Vcc | Floating |
| | SGD1_0''' | 0 V | 0 V or −2 V | 0 V |
| | WLn''' | 0 V | 0 V | 0 V |
| | . . . | 0 V | 0 V | 0 V |
| | SEL_WL''' | 0 V | 0 V | 0 V |
| | . . . | 0 V | 0 V | 0 V |
| | WL0''' | 0 V | 0 V | 0 V |
| | SGS1_0''' | 0 V | 0 V | 0 V |
| | SL''' | 0 V | 0 V | 0 V |

TABLE 2-12

| | | Read | Program | Erase |
|---|---|---|---|---|
| 3$^{rd}$ layer unselected memory block (sharing BL with 110BL2) | BL0 | 1 V | Vcc –> 0 V/Vcc | Floating |
| | SGD2_0''' | 0 V | 0 V or −2 V | 0 V |
| | WLn''' | 0 V | 0 V | 0 V |
| | . . . | 0 V | 0 V | 0 V |
| | SEL_WL''' | 0 V | 0 V | 0 V |
| | . . . | 0 V | 0 V | 0 V |
| | WL0''' | 0 V | 0 V | 0 V |
| | SGS2_0''' | 0 V | 0 V | 0 V |
| | SL''' | 0 V | 0 V | 0 V |

TABLE 2-13

|  |  | Read | Program | Erase |
|---|---|---|---|---|
| $4^{th}$ layer unselected Memory block (Sharing BL with 110BL2) | BL0 | 1 V | Vcc -> 0 V/Vcc | Floating |
| | SGD3_0''' | 0 V | 0 V or -2 V | 0 V |
| | WLn''' | 0 V | 0 V | 0 V |
| | ... | 0 V | 0 V | 0 V |
| | SEL_WL''' | 0 V | 0 V | 0 V |
| | ... | 0 V | 0 V | 0 V |
| | WL0''' | 0 V | 0 V | 0 V |
| | SGS3_0''' | 0 V | 0 V | 0 V |
| | SL''' | 0 V | 0 V | 0 V |

Figure 10:
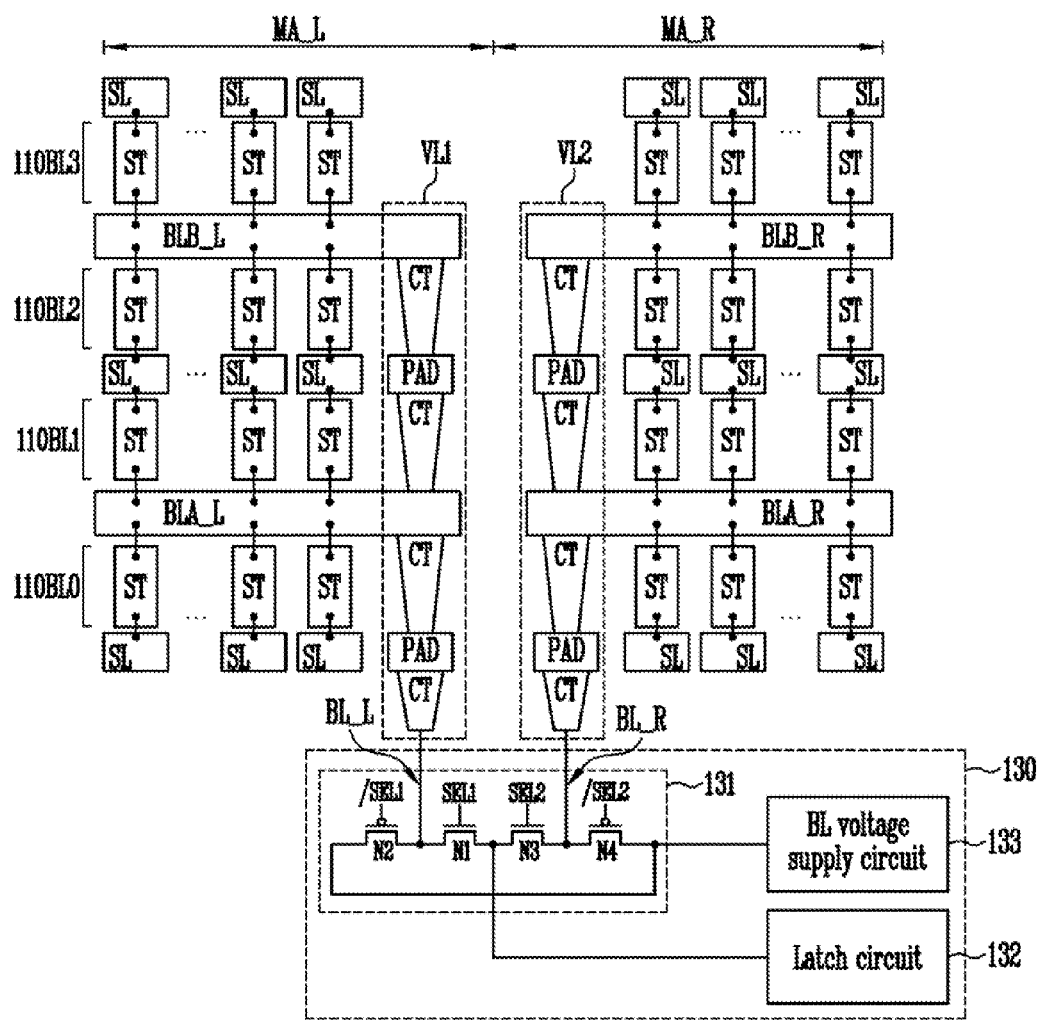

Referring to FIG. 10, the memory blocks of the memory block layers 110BL0, 110BL1, 1101B12 and 1101B13 may be divided into two memory block groups MA_L and MA_R. Bit lines BLA_L and BLB_L of the first memory block group MA_L may be separated from bit lines BLA_R and BLB_R of the second memory block group MA_R, respectively. In addition, a first vertical line VL1 may be formed between the memory block groups MA_L and MA_R in order to couple the lower bit line BLA_L and the upper bit line BLB_L of the first memory block group MA_L, and a second vertical line VL2 may be formed between the lower bit line BLA_R and the upper bit line BLB_R of the second memory block group MA_R.

In the first memory block group MA_L, the read operation, the program operation and the erase operation of the selected memory string ST2_0, the voltage supply circuit 120 and the read/write circuit 130 may apply operating voltages as shown below in Table 3. In order to block the read operation, the program operation or the erase operation of the unselected memory strings ST0, ST1 and ST3 to which the same operating voltages are applied, different operating voltages may be applied to the selection lines as described with reference to FIG. 7, Table 3-1 to Table 3-9 of the first memory block group MA_L and Table 3-10 to Table 3-13 of the second memory block group MA_R.

TABLE 3-1

|  |  |  | Read | Program | Erase |
|---|---|---|---|---|---|
| Memory string(ST0) of $1^{st}$ layer M/B (110BL0) | (Sharing SL & BL_L & WL with ST2_0) | BL_L0 | 1 V | Vcc -> 0 V/Vcc | Floating |
| | | SGD0_0 | 4 V | 5 V -> 0 V or -2 V | 0 V |
| | | WLn | Vpass_read | Vpass_pgm | -10 V |
| | | ... | Vpass_read | Vpass_pgm | -10 V |
| | | SEL_WL | Vread | Vpgm | -10 V |
| | | ... | Vpass_read | Vpass_pgm | -10 V |
| | | WL0 | Vpass_read | Vpass_pgm | -10 V |
| | | SGS0_0 | 0 V | 0 V or -2 V | 0 V or -2 V |
| | | SL | 0 V | Vcc | Verase(8 V) |

TABLE 3-2

|  |  | Read | Program | Erase |
|---|---|---|---|---|
| $1^{st}$ layer unselected Memory block (sharing BL_L with 110BL2) | BL_L0 | 1 V | Vcc -> 0 V/Vcc | Floating |
| | SGD0_0' | 0 V | 0 V or -2 V | 0 V |
| | WLn' | 0 V | 0 V | 0 V |
| | ... | 0 V | 0 V | 0 V |
| | SEL_WL' | 0 V | 0 V | 0 V |
| | ... | 0 V | 0 V | 0 V |
| | WL0' | 0 V | 0 V | 0 V |
| | SGS0_0' | 0 V | 0 V | 0 V |
| | SL' | 0 V | 0 V | 0 V |

TABLE 3-3

|  |  |  | Read | Program | Erase |
|---|---|---|---|---|---|
| memory string(ST1) of $2^{nd}$ layer M/B (110BL1) | (Sharing SL & BL_L & WL with ST2_0) | BL_L0 | 1 V | Vcc -> 0 V/Vcc | Floating |
| | | SGD1_0 | 4 V | 5 V -> 0 V or -2 V | 0 V |
| | | WLn | Vpass_read | Vpass_pgm | -10 V |
| | | ... | Vpass_read | Vpass_pgm | -10 V |
| | | SEL_WL | Vread | Vpgm | -10 V |
| | | ... | Vpass_read | Vpass_pgm | -10 V |
| | | WL0 | Vpass_read | Vpass_pgm | -10 V |
| | | SGS1_0 | 0 V | 0 V or -2 V | 0 V or -2 V |
| | | SL | 0 V | Vcc | Verase(8 V) |

TABLE 3-4

|  |  | Read | Program | Erase |
|---|---|---|---|---|
| $2^{nd}$ layer unselected Memory block (sharing BL_L | BL_L0 | 1 V | Vcc −> 0 V/Vcc | Floating |
|  | SGD1_0' | 0 V | 0 V or −2 V | 0 V |
|  | WLn' | 0 V | 0 V | 0 V |
|  | ... | 0 V | 0 V | 0 V |

TABLE 3-4-continued

|  |  | Read | Program | Erase |
|---|---|---|---|---|
| with 110BL2) | SEL_WL' | 0 V | 0 V | 0 V |
|  | ... | 0 V | 0 V | 0 V |
|  | WL0' | 0 V | 0 V | 0 V |
|  | SGS1_0' | 0 V | 0 V | 0 V |
|  | SL' | 0 V | 0 V | 0 V |

TABLE 3-5

|  |  |  | Read | Program | Erase |
|---|---|---|---|---|---|
| memory string(ST2_1) of $3^{rd}$ layer M/B (110BL2) | (Sharing SL & WL with ST2_0) | BL_LK | 1 V | Vcc −> 0 V/Vcc | Floating |
|  |  | SGD2_0 | 0 V | 5 V −> 0 V or −2 V | 0 V |
|  |  | WLn | Vpass_read | Vpass_pgm | −10 V |
|  |  | ... | Vpass_read | Vpass_pgm | −10 V |
|  |  | SEL_WL | Vread | Vpgm | −10 V |
|  |  | ... | Vpass_read | Vpass_pgm | −10 V |
|  |  | WL0 | Vpass_read | Vpass_pgm | −10 V |
|  |  | SGS2_0 | 4 V | 0 V or −2 V | Verase(8 V) |
|  |  | SL | 0 V | Vcc | Verase(8 V) |

TABLE 3-6

|  |  |  | Read | Program | Erase |
|---|---|---|---|---|---|
| memory string(ST2_0) of $3^{rd}$ layer M/B (110BL2) | (selected) | BL_L0 | 1 V | Vcc −> 0 V/Vcc | Floating |
|  |  | SGD2_0 | 4 V | 5 V −> 1.5 V | 0 V |
|  |  | WLn | Vpass_read | Vpass_pgm | −10 V |
|  |  | ... | Vpass_read | Vpass_pgm | −10 V |
|  |  | SEL_WL | Vread | Vpgm | −10 V |
|  |  | ... | Vpass_read | Vpass_pgm | −10 V |
|  |  | WL0 | Vpass_read | Vpass_pgm | −10 V |
|  |  | SGS2_0 | 4 V | 0 V or −2 V | Verase(8 V) |
|  |  | SL | 0 V | Vcc | Verase(8 V) |

TABLE 3-7

|  |  | Read | Program | Erase |
|---|---|---|---|---|
| $3^{rd}$ layer unselected memory block (sharing BL_L with 110BL2) | BL_L0 | 1 V | Vcc −> 0 V/Vcc | Floating |
|  | SGD2_0' | 0 V | 0 V or −2 V | 0 V |
|  | WLn' | 0 V | 0 V | 0 V |
|  | ... | 0 V | 0 V | 0 V |
|  | SEL_WL' | 0 V | 0 V | 0 V |
|  | ... | 0 V | 0 V | 0 V |
|  | WL0' | 0 V | 0 V | 0 V |
|  | SGS2_0' | 0 V | 0 V | 0 V |
|  | SL' | 0 V | 0 V | 0 V |

TABLE 3-8

|  |  |  | Read | Program | Erase |
|---|---|---|---|---|---|
| memory string(ST3) of $4^{th}$ layer M/B (110BL3) | (Sharing SL & BL_L & WL with ST2_0) | BL_L0 | 1 V | Vcc −> 0 V/Vcc | Floating |
|  |  | SGD3_0 | 4 V | 5 V −> 0 V or −2 V | 0 V |
|  |  | WLn | Vpass_read | Vpass_pgm | −10 V |
|  |  | ... | Vpass_read | Vpass_pgm | −10 V |
|  |  | SEL_WL | Vread | Vpgm | −10 V |
|  |  | ... | Vpass_read | Vpass_pgm | −10 V |
|  |  | WL0 | Vpass_read | Vpass_pgm | −10 V |
|  |  | SGS3_0 | 0 V | 0 V or −2 V | 0 V or −2 V |
|  |  | SL | 0 V | Vcc | Verase(8 V) |

TABLE 3-9

|  |  | Read | Program | Erase |
|---|---|---|---|---|
| 4$^{th}$ layer unselected Memory block (Sharing BL_L with 110BL2) | BL_L0 | 1 V | Vcc -> 0 V/Vcc | Floating |
|  | SGD3_0' | 0 V | 0 V or −2 V | 0 V |
|  | WLn' | 0 V | 0 V | 0 V |
|  | ... | 0 V | 0 V | 0 V |
|  | SEL_WL' | 0 V | 0 V | 0 V |
|  | ... | 0 V | 0 V | 0 V |
|  | WL0' | 0 V | 0 V | 0 V |
|  | SGS3_0' | 0 V | 0 V | 0 V |
|  | SL' | 0 V | 0 V | 0 V |

TABLE 3-10

|  |  | Read | Program | Erase |
|---|---|---|---|---|
| 1$^{st}$ layer unselected Memory block (Coupled to BL_R) | BL_L0 | 0 V | 0 V | Floating |
|  | SGD0_0''' | 0 V | 0 V or −2 V | 0 V |
|  | WLn''' | 0 V | 0 V | 0 V |
|  | ... | 0 V | 0 V | 0 V |
|  | SEL_WL''' | 0 V | 0 V | 0 V |
|  | ... | 0 V | 0 V | 0 V |
|  | WL0''' | 0 V | 0 V | 0 V |
|  | SGS0_0''' | 0 V | 0 V | 0 V |
|  | SL''' | 0 V | 0 V | 0 V |

TABLE 3-11

|  |  | Read | Program | Erase |
|---|---|---|---|---|
| 2$^{nd}$ layer unselected Memory block (Coupled to BL_R) | BL_L0 | 0 V | 0 V | Floating |
|  | SGD1_0''' | 0 V | 0 V or −2 V | 0 V |
|  | WLn''' | 0 V | 0 V | 0 V |
|  | ... | 0 V | 0 V | 0 V |
|  | SEL_WL''' | 0 V | 0 V | 0 V |
|  | ... | 0 V | 0 V | 0 V |
|  | WL0''' | 0 V | 0 V | 0 V |
|  | SGS1_0''' | 0 V | 0 V | 0 V |
|  | SL''' | 0 V | 0 V | 0 V |

TABLE 3-12

|  |  | Reed | Program | Erase |
|---|---|---|---|---|
| 3$^{rd}$ layer unselected Memory block (Coupled to BL_R) | BL_L0 | 0 V | 0 V | Floating |
|  | SGD2_0''' | 0 V | 0 V or −2 V | 0 V |
|  | WLn''' | 0 V | 0 V | 0 V |
|  | — | 0 V | 0 V | 0 V |
|  | SEL_WL''' | 0 V | 0 V | 0 V |
|  | — | 0 V | 0 V | 0 V |
|  | WL0''' | 0 V | 0 V | 0 V |
|  | SGS2_0''' | 0 V | 0 V | 0 V |
|  | SL''' | 0 V | 0 V | 0 V |

TABLE 3-13

|  |  | Reed | Program | Erase |
|---|---|---|---|---|
| 4$^{th}$ layer unselected Memory block (Coupled to BL_R) | BL_L0 | 0 V | 0 V | Floating |
|  | SGD3_0''' | 0 V | 0 V or −2 V | 0 V |
|  | WLn''' | 0 V | 0 V | 0 V |
|  | — | 0 V | 0 V | 0 V |
|  | SEL_WL''' | 0 V | 0 V | 0 V |
|  | — | 0 V | 0 V | 0 V |
|  | WL0''' | 0 V | 0 V | 0 V |
|  | SGS3_0''' | 0 V | 0 V | 0 V |
|  | SL''' | 0 V | 0 V | 0 V |

The bit line switching circuit 131 of the read/write circuit 130 may couple a bit line, for example, BL_L of a selected memory block group to the latch circuit 132 and couple a bit line, for example, BL_R of an unselected memory block group to the BL voltage supply circuit 133 based on a first selection signal SEL1 for selecting the first memory block group MA_L, a second selection signal SEL2 for selecting the second memory block group MA_R and the inverted selection signals /SEL1 and /SEL2 thereof.

According to the embodiment, since lengths of bit lines may be reduced by half, time taken to precharge the bit lines may be reduced, and deterioration of characteristics caused by interference between the bit lines may be reduced.

Figure 11A:
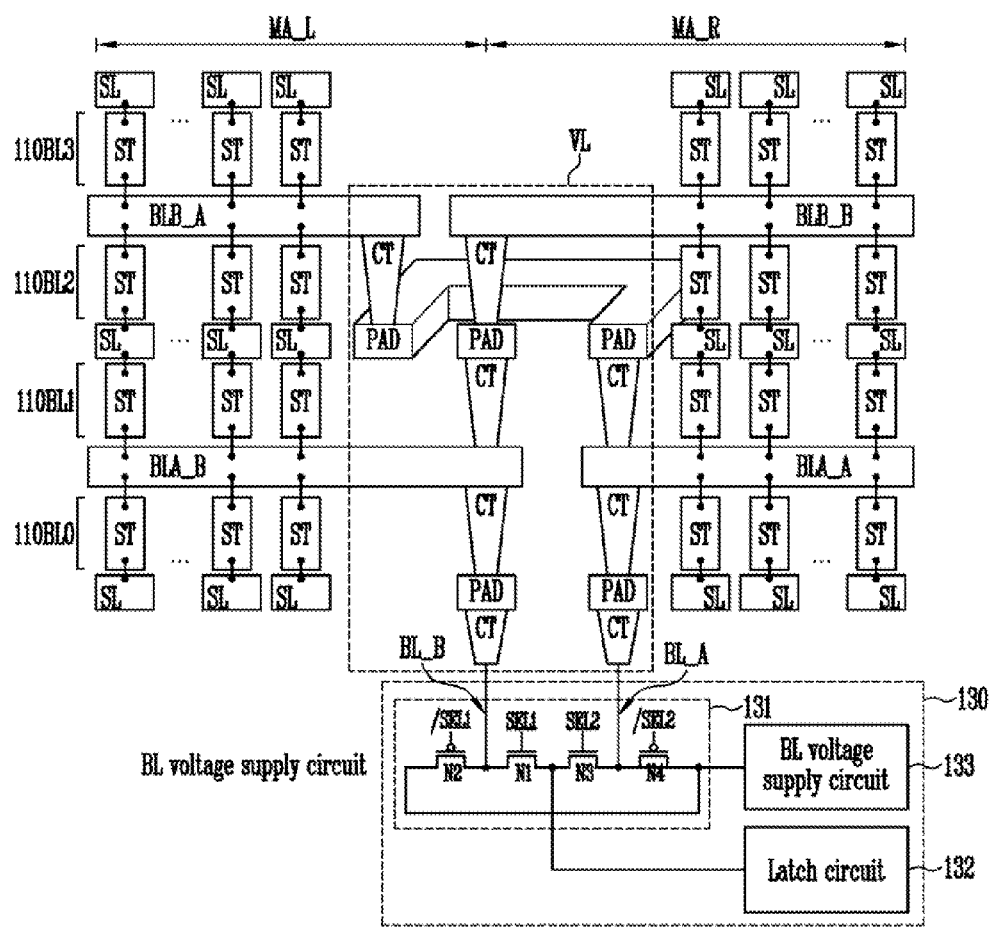
Figure 11B:
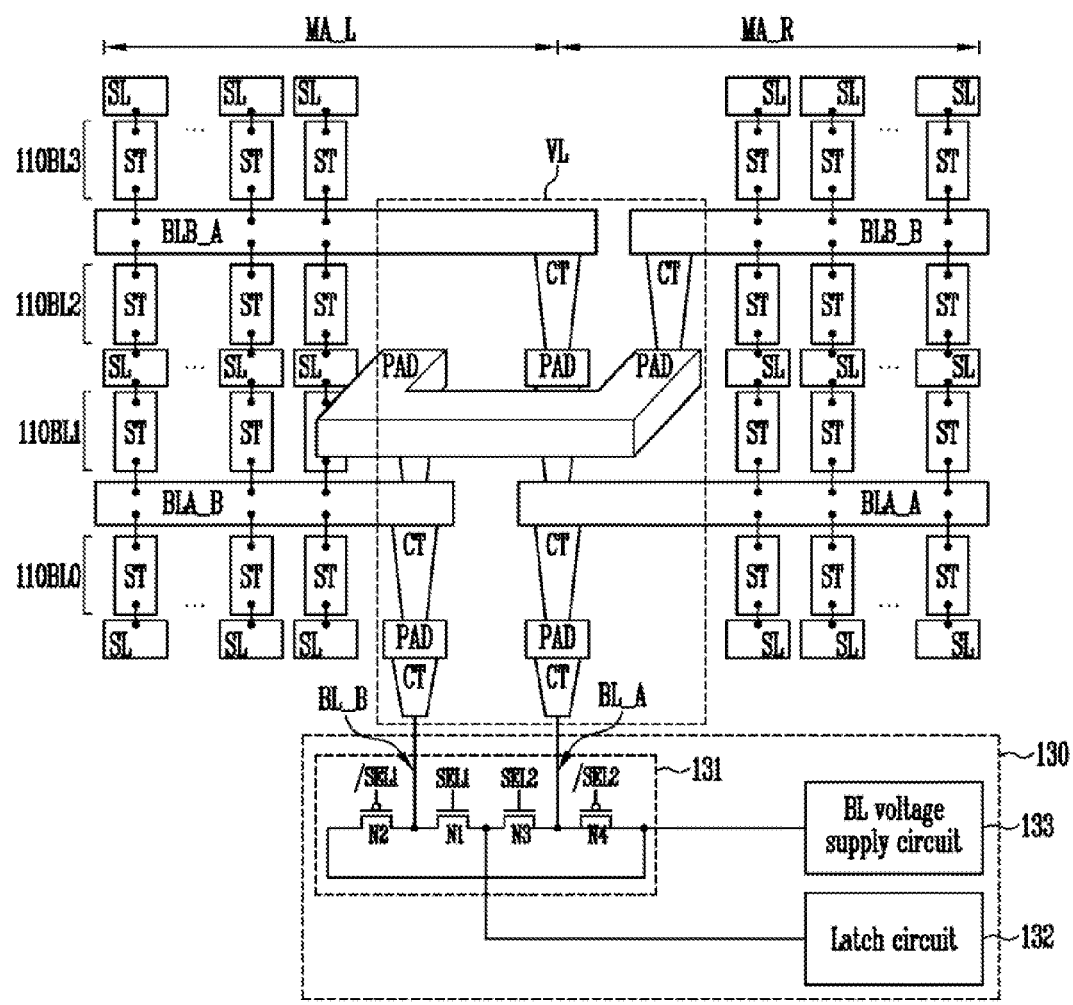

Referring to FIGS. 11A and 11B, the memory blocks of the memory block layers 110BL0, 110BL1, 110BL2 and 110BL3 may be divided into the two memory block groups MA_L and MA_R. Bit lines BLA_B and BLB_A of the first memory block group MA_L may be separated from bit lines BLA_A and BLB_B of the second memory block group MA_R, respectively. In addition, the vertical line VL may be formed between the memory block groups MA_L and MA_R in order to couple the lower bit line BLA_B of the first memory block group MA_L to the upper bit line BLB_B of the second memory block group MA_R and to couple the upper bit line BLA_A of the first memory block group MA_L to the lower bit line BLA_A of the second memory block group MA_R.

During a read operation, a program operation and an erase operation of the selected memory string ST2_0 in the first memory block group MA_L, the voltage supply circuit 120 and the read/write circuit 130 may apply operating voltages as shown below in Table 4-1 to Table 4-9 of the first memory block group MA_L and Table 4-10 to Table 4-13 of the second memory block group MA_R.

TABLE 4-1

|  |  |  | Reed | Program | Erase |
|---|---|---|---|---|---|
| Memory string (ST0) of 1$^{st}$ layer M/B (110BL0) | (Sharing SL & WL with ST2_0) (Coupled to BL_B) | BL_B0 | Vcc | Vcc | Floating |
|  |  | SGD0_0 | 4 V | 5 V -> 0 V or −2 V | 0 V |
|  |  | WLn | Vpass_read | Vpass_pgm | −10 V |
|  |  | — | Vpass_read | Vpass_pgm | −10 V |
|  |  | SEL_WL | Vread | Vpgm | −10 V |
|  |  | — | Vpass_read | Vpass_pgm | −10 V |
|  |  | WL0 | Vpass_read | Vpass_pgm | −10 V |
|  |  | SGS0_0 | 0 V | 0 V or −2 V | 0 V or −2 V |
|  |  | SL | 0 V | Vcc | Verase(8 V) |

TABLE 4-2

|  |  | Reed | Program | Erase |
|---|---|---|---|---|
| 1st layer unselected Memory block | BL_L0 | Vcc | Vcc | Floating |
| | SGD0_0' | 0 V | 0 V or −2 V | 0 V |
| | WLn' | 0 V | 0 V | 0 V |
| | — | 0 V | 0 V | 0 V |

TABLE 4-2-continued

|  |  | Reed | Program | Erase |
|---|---|---|---|---|
| (Coupled to BL_B) | SEL_WL' | 0 V | 0 V | 0 V |
| | — | 0 V | 0 V | 0 V |
| | WL0' | 0 V | 0 V | 0 V |
| | SGS0_0' | 0 V | 0 V | 0 V |
| | SL' | 0 V | 0 V | 0 V |

TABLE 4-3

|  |  |  | Reed | Program | Erase |
|---|---|---|---|---|---|
| memory string (ST1) of 2nd layer M/B (110BL1) | (Sharing SL & WL with ST2_0) (Coupled to BL_B) | BL_B0 | Vcc | Vcc | Floating |
| | | SGD1_0 | 4 V | 5 V -> 0 V or −2 V | 0 V |
| | | WLn | Vpass_read | Vpass_pgm | −10 V |
| | | — | Vpass_read | Vpass_pgm | −10 V |
| | | SEL_WL | Vread | Vpgm | −10 V |
| | | — | Vpass_read | Vpass_pgm | −10 V |
| | | WL0 | Vpass_read | Vpass_pgm | −10 V |
| | | SGS1_0 | 0 V | 0 V or −2 V | 0 V or −2 V |
| | | SL | 0 V | Vcc | Verase(8 V) |

TABLE 4-4

|  |  | Reed | Program | Erase |
|---|---|---|---|---|
| 2nd layer unselected Memory block (Coupled to BL_B) | BL_L0 | Vcc | Vcc | Floating |
| | SGD1_0' | 0 V | 0 V or −2 V | 0 V |
| | WLn' | 0 V | 0 V | 0 V |
| | — | 0 V | 0 V | 0 V |
| | SEL_WL' | 0 V | 0 V | 0 V |
| | — | 0 V | 0 V | 0 V |
| | WL0' | 0 V | 0 V | 0 V |
| | SGS1_0' | 0 V | 0 V | 0 V |
| | SL' | 0 V | 0 V | 0 V |

TABLE 4-5

|  |  |  | Reed | Program | Erase |
|---|---|---|---|---|---|
| memory string (ST2_i) of 3rd layer M/B (110BL2) | (Sharing SL & WL with ST2_0) | BL_Ak | 1 V | Vcc -> 0 V/Vcc | Floating |
| | | SGD2_0 | 0 V | 5 V -> 0 V or −2 V | 0 V |
| | | WLn | Vpass_read | Vpass_pgm | −10 V |
| | | — | Vpass_read | Vpass_pgm | −10 V |
| | | SEL_WL | Vread | Vpgm | −10 V |
| | | — | Vpass_read | Vpass_pgm | −10 V |
| | | WL0 | Vpass_read | Vpass_pgm | −10 V |
| | | SGS2_0 | 4 V | 0 V or −2 V | Verase(8 V) |
| | | SL | 0 V | Vcc | Verase(8 V) |

TABLE 4-6

|  |  |  | Reed | Program | Erase |
|---|---|---|---|---|---|
| memory string (ST2_0) of 3rd layer M/B (110BL2) | (selected) | BL_A0 | 1 V | Vcc -> 0 V/Vcc | Floating |
| | | SGD2_0 | 4 V | 5 V -> 1.5 V | 0 V |
| | | WLn | Vpass_read | Vpass_pgm | −10 V |
| | | — | Vpass_read | Vpass_pgm | −10 V |
| | | SEL_WL | Vread | Vpgm | −10 V |
| | | — | Vpass_read | Vpass_pgm | −10 V |
| | | WL0 | Vpass_read | Vpass_pgm | −10 V |
| | | SGS2_0 | 4 V | 0 V or −2 V | Verase(8 V) |
| | | SL | 0 V | Vcc | Verase(8 V) |

TABLE 4-7

| | | Reed | Program | Erase |
|---|---|---|---|---|
| $3^{rd}$ layer unselected memory block (sharing BL_A with 110BL2) | BL_A0 | 1 V | Vcc -> 0 V/Vcc | Floating |
| | SGD2_0' | 0 V | 0 V or –2 V | 0 V |
| | WLn' | 0 V | 0 V | 0 V |
| | — | 0 V | 0 V | 0 V |
| | SEL_WL' | 0 V | 0 V | 0 V |
| | — | 0 V | 0 V | 0 V |
| | WL0' | 0 V | 0 V | 0 V |
| | SGS2_0' | 0 V | 0 V | 0 V |
| | SL' | 0 V | 0 V | 0 V |

TABLE 4-12

| | | Reed | Program | Erase |
|---|---|---|---|---|
| $3^{rd}$ layer unselected Memory block (Coupled to to BL_B) | BL_B0 | Vcc | Vcc | Floating |
| | SGD2_0''' | 0 V | 0 V or –2 V | 0 V |
| | WLn''' | 0 V | 0 V | 0 V |
| | — | 0 V | 0 V | 0 V |
| | SEL_WL''' | 0 V | 0 V | 0 V |
| | — | 0 V | 0 V | 0 V |
| | WL0''' | 0 V | 0 V | 0 V |
| | SGS2_0''' | 0 V | 0 V | 0 V |
| | SL''' | 0 V | 0 V | 0 V |

TABLE 4-8

| | | | Reed | Program | Erase |
|---|---|---|---|---|---|
| memory string (ST3) of $4^{th}$ layer M/B (110BL3) | (Sharing SL & BL_A & WL with ST2_0) | BL_A0 | 1 V | Vcc -> 0 V/Vcc | Floating |
| | | SGD3_0 | 4 V | 5 V -> 0 V or –2 V | 0 V |
| | | WLn | Vpass_read | Vpass_pgm | –10 V |
| | | — | Vpass_read | Vpass_pgm | –10 V |
| | | SEL_WL | Vread | Vpgm | –10 V |
| | | — | Vpass_read | Vpass_pgm | –10 V |
| | | WL0 | Vpass_read | Vpass_pgm | –10 V |
| | | SGS3_0 | 0 V | 0 V or –2 V | 0 V or –2 V |
| | | SL | 0 V | Vcc | Verase(8 V) |

TABLE 4-9

| | | Reed | Program | Erase |
|---|---|---|---|---|
| $4^{th}$ layer unselected Memory block (Sharing BL_A with 110BL2) | BL_A0 | 1 V | Vcc -> 0 V/Vcc | Floating |
| | SGD3_0' | 0 V | 0 V or –2 V | 0 V |
| | WLn' | 0 V | 0 V | 0 V |
| | — | 0 V | 0 V | 0 V |
| | SEL_WL' | 0 V | 0 V | 0 V |
| | — | 0 V | 0 V | 0 V |
| | WL0' | 0 V | 0 V | 0 V |
| | SGS3_0' | 0 V | 0 V | 0 V |
| | SL' | 0 V | 0 V | 0 V |

TABLE 4-10

| | | Reed | Program | Erase |
|---|---|---|---|---|
| $1^{st}$ layer unselected Memory block (Sharing BL_A with 110BL2) | BL_A0 | 1 V | Vcc -> 0 V/Vcc | Floating |
| | SGD0_0''' | 0 V | 0 V or –2 V | 0 V |
| | WLn''' | 0 V | 0 V | 0 V |
| | — | 0 V | 0 V | 0 V |
| | SEL_WL''' | 0 V | 0 V | 0 V |
| | — | 0 V | 0 V | 0 V |
| | WL0''' | 0 V | 0 V | 0 V |
| | SGS0_0''' | 0 V | 0 V | 0 V |
| | SL''' | 0 V | 0 V | 0 V |

TABLE 4-11

| | | Reed | Program | Erase |
|---|---|---|---|---|
| $2^{nd}$ layer unselected Memory block (Sharing BL_A with 110BL2) | BL_A0 | 1 V | Vcc -> 0 V/Vcc | Floating |
| | SGD1_0''' | 0 V | 0 V or –2 V | 0 V |
| | WLn''' | 0 V | 0 V | 0 V |
| | — | 0 V | 0 V | 0 V |
| | SEL_WL''' | 0 V | 0 V | 0 V |
| | — | 0 V | 0 V | 0 V |
| | WL0''' | 0 V | 0 V | 0 V |
| | SGS1_0''' | 0 V | 0 V | 0 V |
| | SL''' | 0 V | 0 V | 0 V |

TABLE 4-13

| | | Reed | Program | Erase |
|---|---|---|---|---|
| $4^{th}$ layer unselected Memory block (Coupled to to BL_B) | BL_B0 | Vcc | Vcc | Floating |
| | SGD3_0''' | 0 V | 0 V or –2 V | 0 V |
| | WLn''' | 0 V | 0 V | 0 V |
| | — | 0 V | 0 V | 0 V |
| | SEL_WL''' | 0 V | 0 V | 0 V |
| | — | 0 V | 0 V | 0 V |
| | WL0''' | 0 V | 0 V | 0 V |
| | SGS3_0''' | 0 V | 0 V | 0 V |
| | SL''' | 0 V | 0 V | 0 V |

In order to block the read operation, the program operation or the erase operation of the unselected memory strings ST0, ST1 and ST3, in which the same operating voltages are applied to the word lines WL0 to WLn, different operating voltages may be applied to the selection lines as shown in Table 1. In addition, among the memory strings in which the same operating voltages are applied to the word lines WL0 to WLn, bit line BLA_B shared by the lower memory strings ST0 and ST1, and bit line BLB_A shared by the upper memory strings ST2_0, ST3 may be separated from each other. Therefore, by applying a precharge voltage of, for example, Vcc or a program inhibit voltage of, for example, Vcc to the lower bit line BLA_B, which is shared by the unselected lower memory strings ST0 and ST1 during a read operation or a program operation of the selected memory string ST2_0, read disturb characteristics and program disturb characteristics of the memory cells included in the unselected lower memory strings ST0 and ST1 may be improved.

Figure 12:
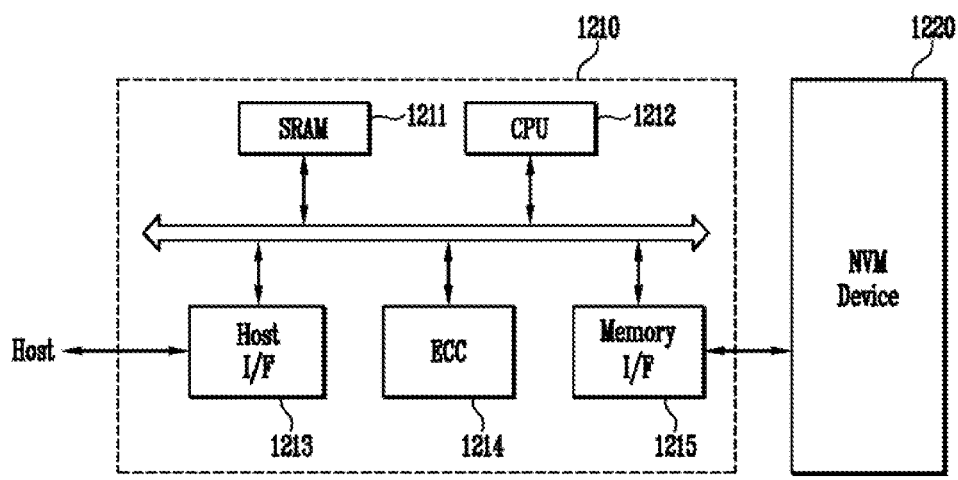
FIG. 12 is a block diagram illustrating a memory system according to an embodiment of the present invention.

FIG. 12 is a block diagram illustrating a memory system according to an embodiment of the present invention.

Referring to FIG. 12, a memory system 1200 according to an embodiment of the present invention may include a non-volatile memory device 1220 and a memory controller 1210.

The non-volatile memory device 1220 may be provided as the above-described semiconductor memory device. The memory controller 1210 may control the non-volatile memory device 1220 in a general operation mode, such as a program loop, a read operation or an erase loop.

The memory system 1200 may be a solid state disk (SSD) or a memory card in which the memory device 1220 and the memory controller 1210 are combined. An SRAM 1211 may function as an operation memory of a CPU 1212. The CPU 1212 may perform the general control operation for data exchange of the memory controller 1210. A host interface 1213 may include a data exchange protocol of a host being coupled to the memory system 1200. An ECC 1214 may detect and correct errors included in a data read from the non-volatile memory device 1220. The memory interface 1215 may interface with the non-volatile memory device 1220. The CPU 1212 may perform the general control operation for data exchange of the memory controller 1210.

Though not illustrated in FIG. 12, the memory controller 1210 may further include ROM that stores code data to interface with the host. The non-volatile memory device 1220 may be a multi-chip package composed of a plurality of flash memory chips. The memory system 1200 may be provided as a storage medium having high reliability and low error rate. A flash memory device according to an embodiment of the present invention may be provided in a memory system such as a semiconductor disk device (a solid state disk (SSD)) on which research has been actively conducted. For example, when the memory system 1200 is an SSD, the memory controller 1210 may communicate with an external device, for example, a host) through one of the interface protocols including USB, MMC, PCI-E, SATA, PATA, SCSI, ESDI and IDE.

Figure 13:
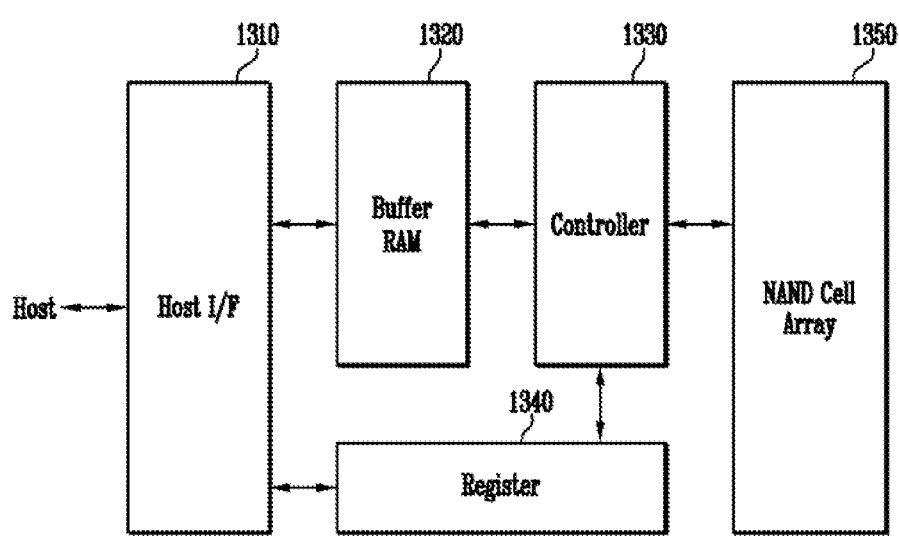
FIG. 13 is a block diagram illustrating a memory system for performing a program operation according to an embodiment of the present invention.

FIG. 13 is a block diagram illustrating a memory system that performs a program operation according to an embodiment of the present invention. For example, technical features of the present invention may be applied to an OneNand flash memory device 1300 as the fusion memory device.

The OneNand flash memory device 1300 may include a host interface (I/F) 1310, a buffer RAM 1320, a controller 1330, a register 1340 and a NAND flash cell array 1350. The host interface 1310 may exchange various types of information with a device through a different protocol. The buffer RAM 1320 may have built-in codes for driving the memory device or temporarily store data. The controller 1330 may control read and program operations and every state based on a control signal and a command that are externally given. The register 1340 may store data including instructions, addresses and configurations defining a system operating environment in the memory device. The NAND flash cell array 1350 may include operating circuits including non-volatile memory cells and page buffers. The memory array of FIG. 2 may be used as a memory array of the NAND flash cell array 1350.

Figure 14:
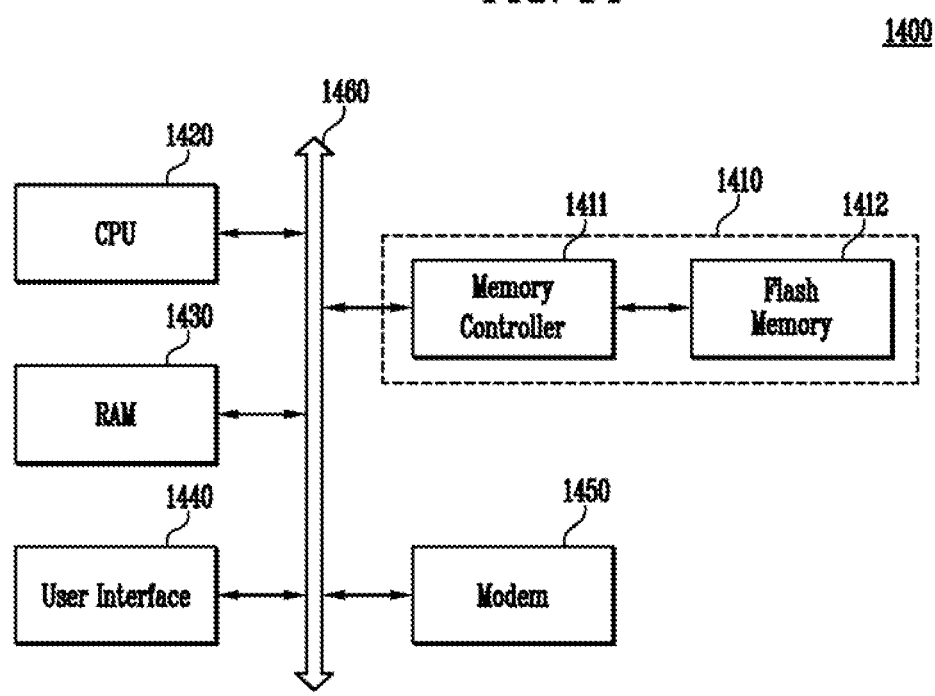
FIG. 14 is a block diagram illustrating a computing system including a flash memory device according to an embodiment of the present invention.

FIG. 14 is a block diagram illustrating a computing system including a flash memory device 1412 according to an embodiment of the present invention.

A computing system 1400 according to an embodiment of the present invention may include a microprocessor (CPU) 1420, RAM 1430, a user interface 1440, a modem 1450, such as a baseband chipset, and a memory system 1410 that are electrically coupled to a system bus 1460. In addition, if the computing system 1400 is a mobile device, then a battery (not illustrated) may be provided to apply operating voltages to the computing system 1400. Though not shown in FIG. 14, the computing system 1400 may further include application chipsets, a Camera Image Processor (CIS), or mobile DRAM. The memory system 1410 may form a Solid State Drive/Disk (SSD) that uses a non-volatile memory to store data. The memory system 1410 may form a solid state drive/disk (SSD) using a non-volatile memory for storing data, or the memory system 1410 may be provided as a fusion flash memory, for example, OneNAND flash memory).

According to embodiments of the present invention, a larger number of memory cells may be formed within a predetermined area and deterioration in electrical characteristics caused thereby may be prevented.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor memory device, comprising:
a memory array including memory blocks stacked in a plurality of layers on a substrate;
first vertical lines suitable for coupling bit lines; and
second vertical lines suitable for coupling word lines of the memory blocks that are vertically stacked,
wherein the memory blocks include selection lines vertically stacked and separated from each other, and
wherein the bit lines are coupled to the memory blocks and arranged in the plurality of layers.

2. The semiconductor memory device of claim 1, wherein word lines of the memory blocks that are arranged in the same layer are separated from each other.

3. The semiconductor memory device of claim 1, wherein the memory block, arranged in an odd-numbered layer, shares the bit lines with the memory block, arranged in an even-numbered layer arranged on the odd-numbered layer and shares common source line with the memory block, arranged in an even-numbered layer arranged under the odd-numbered layer.

4. The semiconductor memory device of claim 3, wherein the bit lines and the common source lines are arranged in a direction crossing each other.

5. The semiconductor memory device of claim 3, wherein the memory block, arranged in the even-numbered layer, and the memory block, arranged in the odd-numbered, are stacked with vertical symmetry.

6. The semiconductor memory device of claim 3, wherein the common source lines of the memory blocks arranged in different layers are coupled to each other, and
wherein the common source lines of the memory blocks arranged in the same layer are separated from each other.

7. The semiconductor memory device of claim 1, wherein each of the memory blocks includes memory strings coupled between the bit lines and a common source line, and
wherein each of the memory strings includes memory cells electrically coupled to the common source line based on a first selection signal applied to a first selection line among the selection lines and to the bit lines based on a second selection signal applied to a second selection line among the selection lines.

8. The semiconductor memory device of claim 7, wherein each of the memory strings further includes:
a first selection transistor coupled to the common source line and operating based on the first selection signal; and
a second selection transistor coupled to the bit line and operating based on the second selection signal, and
wherein the memory cells are vertically coupled in series between the first and second selection transistors.

9. The semiconductor memory device of claim 7, wherein the first selection lines of the memory strings, which are coupled to the same bit line in each of the memory blocks, are separated from each other, and wherein the second selection lines of the memory strings, which are coupled to the same bit line in each of the memory blocks, are separated from each other.

10. The semiconductor memory device of claim 7, wherein the first selection lines of the memory blocks, which are vertically arranged in different layers, are separated from each other, and
wherein the second selection lines of the memory blocks, which are vertically arranged in different layers, are separated from each other.

11. The semiconductor memory device of claim 1, wherein the first vertical lines are located at a center of the memory array.

12. The semiconductor memory device of claim 1, further comprising read/write circuits, each of which is coupled to each of the bit lines.

13. A semiconductor memory device, comprising:
first and second memory arrays respectively including memory blocks stacked in a plurality of layers on a substrate;
first upper bit lines coupled to upper memory blocks among the memory blocks included in the first memory array;
first lower bit lines coupled to lower memory blocks among the memory blocks included in the first memory array;
second upper bit lines coupled to the upper memory blocks among the memory blocks included in the second memory array; and
second lower bit lines coupled to the lower memory blocks among the memory blocks included in the second memory array.

14. The semiconductor memory device of claim 13, further comprising third lines suitable for coupling word lines of the memory blocks that are arranged vertically.

15. The semiconductor memory device of claim 13, wherein the memory block arranged in an even-numbered layer and the memory block arranged in an odd-numbered layer are stacked with vertical symmetry.

16. The semiconductor memory device of claim 13, wherein a lowermost memory block of the first memory array and a memory block located on the lowermost memory block of the first memory array share the first lower bit lines,
wherein an uppermost memory block of the first memory array and a memory block located under the uppermost memory block of the first memory array share the first upper bit lines,
wherein a lowermost memory block of the second memory array and a memory block located on the lowermost memory block of the second memory array share the second lower bit lines, and
wherein an uppermost memory block of the second memory array and a memory block located under the uppermost memory block of the second memory array share the second upper bit lines.

17. The semiconductor memory device of claim 13, wherein the memory blocks of the first memory array and the memory blocks of the second memory array share a common source line.

18. The semiconductor memory device of claim 13, further comprising:
first lines suitable for coupling the first upper bit lines to the first lower bit lines; and
second lines suitable for coupling the second upper bit lines and the second lower bit lines.

19. The semiconductor memory device of claim 18, wherein the first lines and the second lines are located between the first memory array and the second memory array.

20. The semiconductor memory device of claim 13, further comprising:
first lines suitable for coupling the first upper bit lines to the second lower bit lines; and
second lines suitable for coupling the second upper bit lines to the first lower bit lines.

21. The semiconductor memory device of claim 20, wherein the first lines and the second lines are located between the first memory array and the second memory array.

22. The semiconductor memory device of claim 20, further comprising a read/write circuit coupled in common to the first memory array and the second memory array through the first and second upper bit lines and the first and second lower bit lines.

* * * * *